(12) United States Patent
Spiegel et al.

(10) Patent No.: US 10,905,014 B2
(45) Date of Patent: Jan. 26, 2021

(54) APPLICATION SPECIFIC ELECTRONICS PACKAGING SYSTEMS, METHODS AND DEVICES

(71) Applicant: Molex, LLC, Lisle, IL (US)

(72) Inventors: Marko Spiegel, La Fox, IL (US); Victor Zaderej, Wheaton, IL (US); Amrit Panda, Naperville, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/881,017

(22) Filed: May 22, 2020

(65) Prior Publication Data

US 2020/0352032 A1 Nov. 5, 2020

Related U.S. Application Data

(63) Continuation of application No. 16/579,890, filed on Sep. 24, 2019, now Pat. No. 10,667,407, which is a
(Continued)

(51) Int. Cl.
*H05K 3/18* (2006.01)
*H05K 3/20* (2006.01)
(Continued)

(52) U.S. Cl.
CPC .......... *H05K 3/188* (2013.01); *H05K 1/0326* (2013.01); *H05K 1/0346* (2013.01);
(Continued)

(58) Field of Classification Search
CPC ...... H05K 3/188; H05K 3/182; H05K 1/0265; H05K 2201/09118; H05K 1/183
(Continued)

(56) References Cited

U.S. PATENT DOCUMENTS 4,689,103 A * 8/1987 Elarde ................. H05K 3/0097
156/242
4,954,872 A 9/1990 Peterson et al.
(Continued)

FOREIGN PATENT DOCUMENTS

CN 202012788 U 10/2011
EP 0928026 A1 7/1999
(Continued)

OTHER PUBLICATIONS

Notice of allowance received for U.S. Appl. No. 15/737,935, dated Feb. 4, 2019, 16 pages.
(Continued)

*Primary Examiner* — Sherman Ng

(57) ABSTRACT

Depicted embodiments are directed to an Application Specific Electronics Packaging ("ASEP") system, which enables the manufacture of additional products using reel to reel (68a, 68b) manufacturing processes as opposed to the "batch" processes used to currently manufacture electronic products and MIDs. Through certain ASEP embodiments, it is possible to integrate connectors, sensors, LEDs, thermal management, antennas, RFID devices, microprocessors, memory, impedance control, and multi-layer functionality directly into a product.

20 Claims, 23 Drawing Sheets

Related U.S. Application Data continuation of application No. 15/737,935, filed as application No. PCT/US2016/039860 on Jun. 28, 2016, now Pat. No. 10,433,428.

(60) Provisional application No. 62/186,102, filed on Jun. 29, 2015, provisional application No. 62/254,574, filed on Nov. 12, 2015, provisional application No. 62/256,477, filed on Nov. 17, 2015, provisional application No. 62/326,539, filed on Apr. 22, 2016.

(51) Int. Cl.
| | | |
|---|---|---|
| H05K 1/03 | (2006.01) | |
| H05K 1/09 | (2006.01) | |
| H05K 1/18 | (2006.01) | |
| H05K 3/10 | (2006.01) | |
| H05K 1/02 | (2006.01) | |
| H05K 3/02 | (2006.01) | |

(52) U.S. Cl.
CPC .......... *H05K 1/0393* (2013.01); *H05K 1/092* (2013.01); *H05K 1/183* (2013.01); *H05K 3/107* (2013.01); *H05K 3/182* (2013.01); *H05K 3/202* (2013.01); *H05K 1/0265* (2013.01); *H05K 3/027* (2013.01); *H05K 2201/0154* (2013.01); *H05K 2201/09118* (2013.01); *H05K 2201/10106* (2013.01); *H05K 2201/10121* (2013.01); *H05K 2203/0706* (2013.01); *H05K 2203/0709* (2013.01); *H05K 2203/0716* (2013.01); *H05K 2203/108* (2013.01); *H05K 2203/1131* (2013.01)

(58) Field of Classification Search
USPC ....................................................... 361/736
See application file for complete search history.

(56) References Cited

U.S. PATENT DOCUMENTS

| | | | | |
|---|---|---|---|---|
| 5,283,717 | A * | 2/1994 | Hundt | H01L 23/49503 |
| | | | | 361/813 |
| 5,985,696 | A | 11/1999 | Brunner et al. | |
| 6,664,615 | B1 | 12/2003 | Bayan et al. | |
| 7,249,897 | B2 | 7/2007 | Aruga | |
| 7,836,586 | B2 | 11/2010 | Bavan et al. | |
| 9,252,337 | B1 * | 2/2016 | Cumpston | H01L 33/20 |
| 9,829,159 | B2 | 11/2017 | McGowan et al. | |
| 10,433,428 | B2 | 10/2019 | Spiegel et al. | |
| 2006/0145358 | A1 * | 7/2006 | Lee | H01L 23/4093 |
| | | | | 257/778 |
| 2007/0139946 | A1 | 6/2007 | Basile et al. | |
| 2007/0158102 | A1 * | 7/2007 | Monroe | H05K 1/021 |
| | | | | 174/260 |
| 2008/0054432 | A1 * | 3/2008 | Corisis | H01L 23/49575 |
| | | | | 257/686 |
| 2008/0253120 | A1 | 10/2008 | Okimura | |
| 2008/0296599 | A1 * | 12/2008 | Mazzochette | H05K 1/021 |
| | | | | 257/98 |
| 2010/0248475 | A1 | 9/2010 | Mengel et al. | |
| 2011/0003440 | A1 | 1/2011 | Mengel et al. | |
| 2012/0043660 | A1 | 2/2012 | Poddar et al. | |
| 2014/0076489 | A1 * | 3/2014 | Zhao | G06F 3/041 |
| | | | | 156/247 |
| 2015/0006000 | A1 | 1/2015 | Kawata et al. | |
| 2016/0084905 | A1 | 3/2016 | Gandhi et al. | |
| 2018/0080610 | A1 | 3/2018 | McGowan et al. | |

FOREIGN PATENT DOCUMENTS

| | | |
|---|---|---|
| GB | 2 290 912 A | 1/1996 |
| JP | H09-274121 A | 10/1997 |
| JP | 2007-012713 A | 1/2007 |
| JP | 2007-273533 A | 10/2007 |
| JP | 2010-140820 A | 6/2010 |
| JP | 2012-038914 A | 2/2012 |
| JP | 2014-027265 A | 2/2014 |
| KR | 10-0937136 B1 | 1/2010 |
| WO | 2017/004064 A1 | 1/2017 |

OTHER PUBLICATIONS

Extended European Search Report received for European Patent Application No. 16818608.8, dated Feb. 22, 2019, 12 pages.
International Search Report and Written Opinion received for PCT application No. PCT/US2016/039860, dated Oct. 12, 2016, 14 pages.
International Preliminary Report on Patentability received for PCT Application No. PCT/US2016/039860, dated Jan. 11, 2018, 13 pages.
Office Action received for Japanese Patent Application No. 2017-568255, dated Mar. 19, 2019, 13 pages. (7 pages of English Translation and 6 pages of Official copy).
Notice of allowance received for U.S. Appl. No. 16/579,890, dated Jan. 14, 2020, 15 pages.
Notification of Reasons for Refusal received for Japanese application No. 2017-568255, dated Mar. 3, 2020, 9 pages. (5 pages of English translation and 4 pages of Original copy).

* cited by examiner

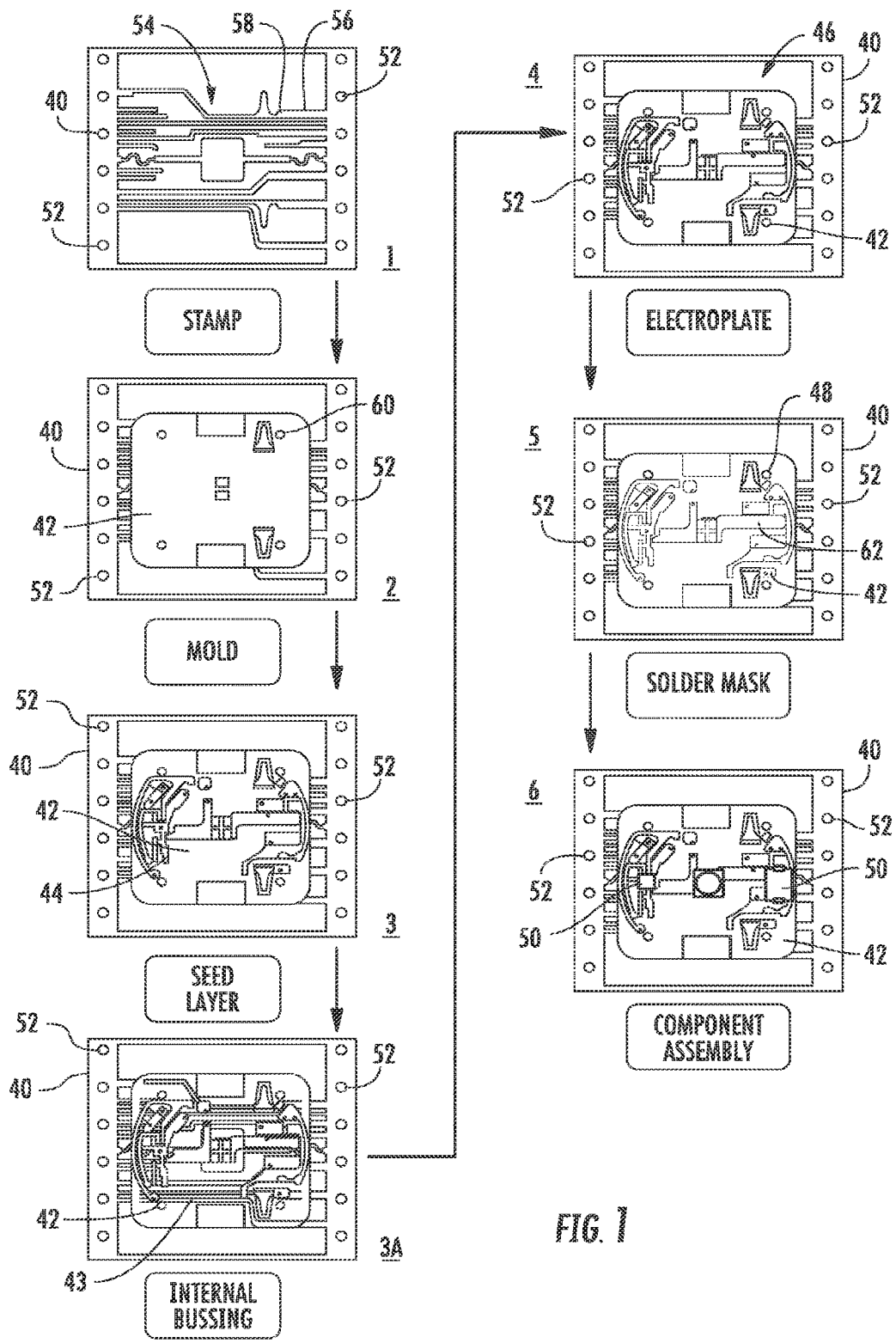

APPLICATION SPECIFIC ELECTRONICS PACKAGING SYSTEMS, METHODS AND DEVICES

RELATED APPLICATIONS

This application is a continuation of U.S. application Ser. No. 16/579,890, filed Sep. 24, 2019, now U.S. Pat. No. 10,667,407, which claims priority to U.S. application Ser. No. 15/737,935, filed Dec. 19, 2017, now U.S. Pat. No. 10,433,428, which claims priority to International Application No. PCT/US2016/039860, filed Jun. 28, 2016, which claims priority to U.S. Provisional Application No. 62/186,102, filed Jun. 29, 2015, to U.S. Provisional Application No. 62/254,574, filed Nov. 12, 2015, to U.S. Provisional Application No. 62/256,477, filed Nov. 17, 2015, and to U.S. Provisional Application No. 62/326,539, filed Apr. 22, 2016, all of which are incorporated herein by reference in their entirety.

TECHNICAL FIELD

This disclosure relates to electronic devices and the manufacturing of such devices.

BACKGROUND OF THE DISCLOSURE

Molded interconnect devices ("MIDs") are three-dimensional electromechanical parts that typically include plastic components and electronic circuit traces. A plastic substrate or housing is created and electrical circuits and devices are plated, layered or implanted upon the plastic substrate. MIDs typically have fewer parts than conventionally produced devices, which results in space and weight savings. Applications for MID devices include mobile telephones, automated teller machines, steering wheel components for automobiles, RFID components, lighting, medical devices and many consumer goods.

Current processes for manufacturing MIDs include two-shot molding and laser direct structuring (LDS). Two-shot molding involves the use of two separate plastic parts, one platable and one non-platable. The platable part forms the circuitry, and the non-platable part fulfills mechanical functions and completes the molding. The two parts are fused together and circuits are created through use of electroless plating. The platable plastic is metallized, while the non-platable plastic remains non-conductive. LDS, in contrast, involves the steps of injection molding, laser activation of the plastic material, and then metallization. The laser etches a wiring pattern onto the part and prepares it for metallization. With LDS, only a single thermoplastic material is required thereby making the molding step a one-shot process.

There is a need, however, for an improved system and process for rapidly and efficiently manufacturing three dimensional structures that can include a combination of components. In particular, there is a need to add electronics packages into smaller spaces to include more features that operate at higher speeds, while simultaneously using less power and reducing heat, all at a reduced manufacturing cost.

BRIEF SUMMARY OF THE DISCLOSURE

Depicted embodiments are directed to an Application Specific Electronics Packaging ("ASEP") system, which enables the manufacture of additional products using reel to reel (continuous flow) manufacturing processes as opposed to the "batch" processes used to currently manufacture electronic products and MIDs. Through certain ASEP embodiments, it is possible to integrate connectors, sensors, LEDs, thermal management, antennas, RFID devices, microprocessors, memory, impedance control, and multi-layer functionality directly into a product.

An embodiment of the ASEP system relates to a process in which devices are created by continuously depositing seed layer traces after molding a substrate and before electroplating. The application of a seed layer of traces onto a surface of the substrate, which may be 3D, is conducted in a reel-to-reel manufacturing process. A process for making devices preferably includes stamping a flexible carrier which forms a lead frame, molding a plastic substrate onto the carrier, depositing a seed layer of traces that connects to an internal buss formed by the carrier, electroplating the seed layer of traces to form electronic circuit traces, and component assembly. If necessary, a solder masking step may be provided. The process flow can be carried out on the front and back of the substrate and on internal layers as well. These and other aspects and features are described in further detail below.

BRIEF DESCRIPTION OF THE DRAWINGS

FIG. 1 is a flow diagram of a manufacturing process.

Specific embodiments are disclosed below with reference to the drawings listed above. Like numerals/reference symbols may not be intended to represent the same objects from one drawing to the next. In some cases they do while in other cases they do not, as indicated by the context of their use in the detailed description below.

DETAILED DESCRIPTION

The present disclosure is directed to an Application Specific Electronics Packaging ("ASEP") system and method. The process is useful for the creation of devices such as printed circuit boards, flex circuits, connectors, thermal management features, EMI Shielding, high current conductors, RFID apparatuses, antennas, wireless power, sensors, MEMS apparatuses, LEDs, microprocessors and memory, ASICs, passives and other electrical and electro-mechanical apparatuses.

Figure 6:
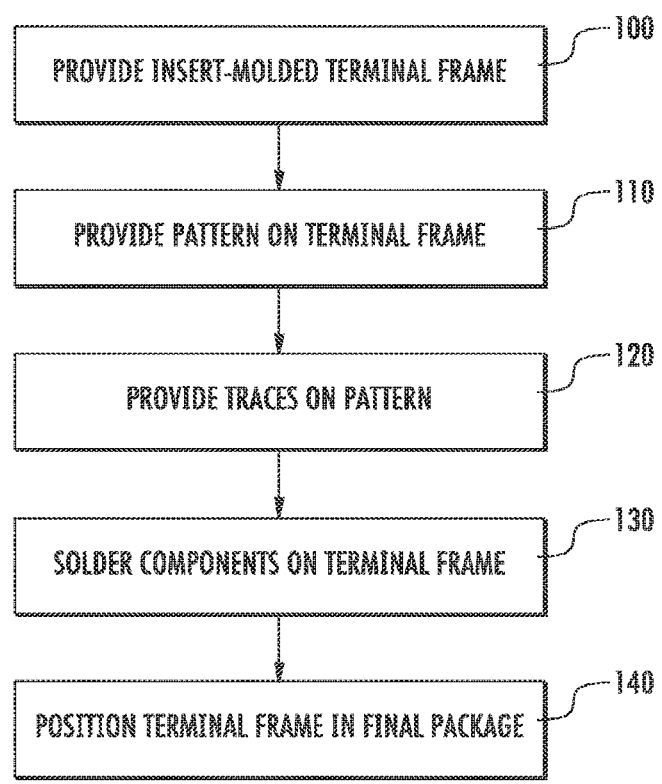
FIG. 6 illustrates a flow chart showing the forming of an assembly.

A flow diagram for an embodiment of an ASEP manufacturing process is shown in FIG. 1 and a flow chart is shown in FIG. 6. At Step 1 of FIG. 1, a stamped carrier 40 is produced from a suitable metal or other material. Next, at Step 2, a separate plastic substrate 42 is overmolded to the stamped carrier 40. This is referenced at reference numeral 100 in FIG. 6. A seed layer of traces 44 are then deposited on the surface of the plastic substrate 42 at Step 3 of FIG. 1 and at reference numeral 110 of FIG. 6, which as can be appreciated from the view provided in Step 3a, allows an internal buss 43 formed by the carrier 40 to be electrically connected to the seed layer of traces 44 on the surface of the plastic substrate 42. The seed layer of traces 44 are electroplated in Step 4 of FIG. 1 and at reference numeral 120 of FIG. 6 by applying a voltage potential to the carrier 40 (which via the internal buss 43 is connected to the seed layer of traces 44) to form a part 46 and then running the part 46 through an electroplating bath. A solder mask 48 may be applied at Step 5. Component assembly occurs at Step 6 of FIG. 1 and at reference numeral 130 of FIG. 6, in which components 50 are attached to the substrate 42 to form the completed device. If the components 50 are soldered, a reflow process may be used to form the completed device. If the components 50 are wire bonded, the solder mask step may be eliminated. In a preferred embodiment, a formed device 22 is manufactured using reel to reel technology. Carrier holes 52 on the side of the carrier 40 are illustrated in the representative drawings in each step and these carrier holes 52 allow the carrier 40 to traverse along a manufacturing line in a continuous flow. The flow diagram of FIG. 1 illustrates seven process steps in a particular order, but persons of skill in the art will appreciate that in certain applications not all of the steps will be needed and thus the order of steps may be modified as appropriate.

In Step 1, the carrier 40 is stamped/formed. The carrier 40 may be stamped/formed from a metal such as copper alloy (or any other desirable conductive material) to form a lead frame 54, or stamped/formed from polyimide flex materials, such as a flexible circuit with one or more layers (in certain embodiments the flex materials can have four or more layers) to form the lead frame 54. As shown in FIG. 1, the lead frame 54 may have fingers 56 with apertures 58 provided in them.

In Step 2, the substrate 42 is molded over the lead frame 54. Apertures 60 may be provided which align with the apertures 58 in the fingers 56.

The continuous deposition of the seed layer of traces 44, as indicated in Step 3 of FIG. 1, is preferably completed after molding as shown in Step 2, and before electroplating as shown in Step 4. The seed layer deposition is accomplished by, for example, an ink jet process, a screening process or an aerosol process as described in more detail below. The connection of the seed layers of traces 44 to the internal buss 43 provided by the carrier 40 enables electroplating of all metals, such as copper, nickel, gold, silver, tin, lead, palladium and other materials. The process of depositing the seed layer of traces 44 that is connected to the internal buss 43 and then electroplating enables faster deposition of metals than known electroless plating processes. In addition, the plating process is smoother and lower cost when implemented using reel to reel technology as compared with more conventional batch processes. The flow diagram of FIG. 1 shows the manufacturing process applied to only one side of the substrate 42, but the manufacturing process may be equally applied to the backside of the substrate 42 and to internal layers. It should be noted that the use of a metal carrier 40 may result in a structure that is best suited for applications where there are just two layers (one on both sides of the plastic substrate 42) in addition to the metal carrier. If there is a desire for additional layers then it has been determined that the use of a carrier 40 formed of a polyimide flex may be more beneficial for allowing additional internal layers to be added. More than one carrier 40 can be provided in the substrate 42.

In an embodiment, the carrier 40 is stamped/formed (Step 1) from flex materials, such as flexible circuit with one or more layers (in certain embodiments the flex materials can have four or more layers) to form the lead frame 54. In an embodiment, the carrier 40 is stamped/formed from a copper alloy (or any other desirable conductive material) to form the lead frame 54. The molding step (Step 2) can rely on single or two shot processes or other conventional molding processes. Following molding, a lithographic or laser pattern is used (Step 3) to form a pattern so as to form the seed layer of traces 44. Thereafter, the seed layer of traces 44 are electroplated (Step 4) to form electronic circuit traces 62. The electroplating step (Step 4) can involve a multi-step plating process that includes additional thickness of copper or other suitable materials.

In another embodiment, techniques such as those included in Mesoscribe technology may be used to deposit a full thickness of copper (or other conductive material) on a surface. A picosecond laser may then be used to isolate desired circuit patterns in the conductive material. Such an approach could be used in place of a plating step, as described elsewhere herein, or in addition to plating, where one or more plated metals are desired.

Figure 2:
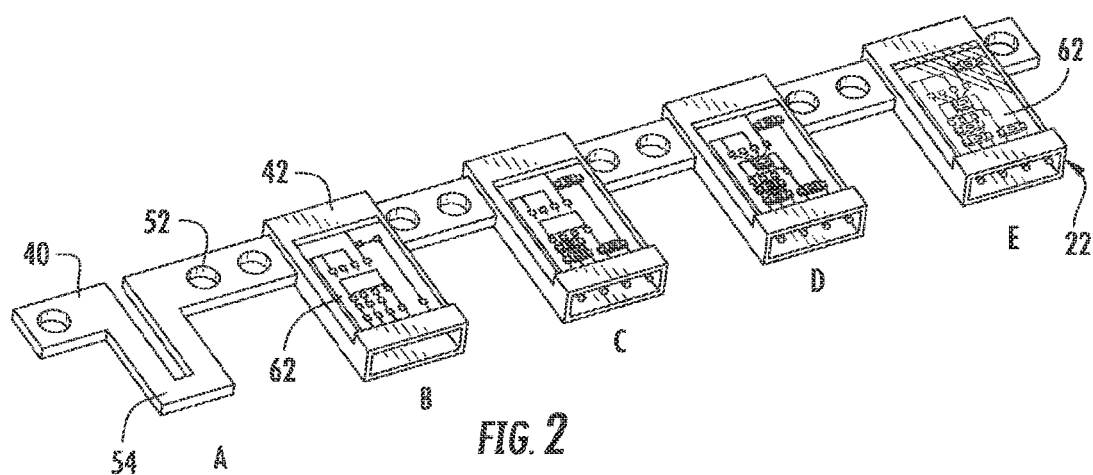
FIG. 2 is an illustration of devices on a carrier at various stages of manufacture.
Figure 3:
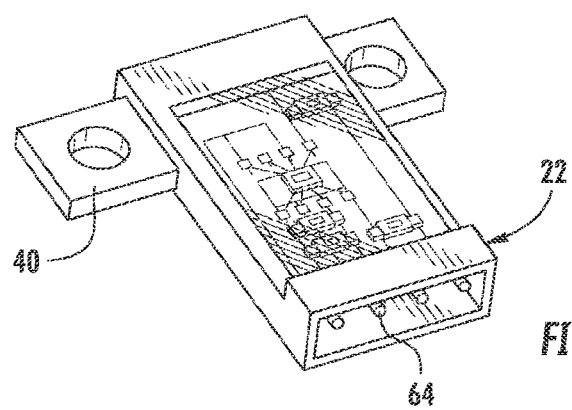
FIG. 3 is an illustration of a completed device separated from a carrier.

FIG. 2 illustrates the device 22 being formed on the carrier 40 at various stages of manufacture. The formed carrier 40, indicated at A, without the molded substrate 42 is illustrated first. The molded substrate 42 with electronic circuit traces 62 is illustrated at B, pin contacts have been added at C, additional circuit metallization is indicated at D, and the completed device 22 is illustrated at reference numeral E. The completed device 22 may be separated from the adjoined carrier 40 as illustrated in FIG. 3 to singulate the device 22. While the carrier 40 is depicted on one side of the device 22 in FIG. 2, the carrier 40 could be provided on both sides of the device 22.

Figure 4:
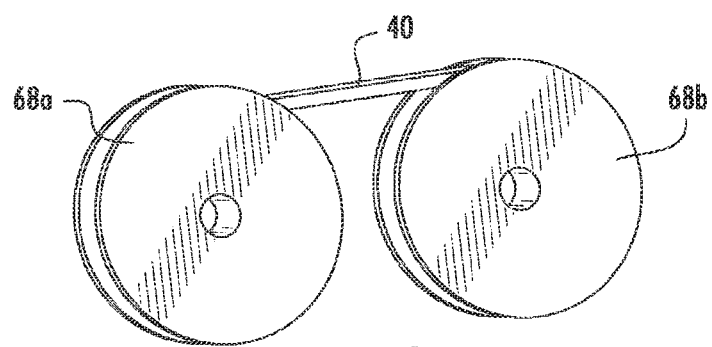
FIG. 4 is a symbolic illustration of a reel-to-reel carrier.

As noted, the process for building the ASEP device 22 is preferably continuous for speed and cost reasons. Reel to reel technology, such as schematically illustrated in FIG. 4, allows the device 22 to be formed while attached to the carrier 40 that is unspooled from a bulk source reel 68a and then collected in a second reel 68b. As can be appreciated, a number of process steps take place between the two reels 68a, 68b.

Figure 5:
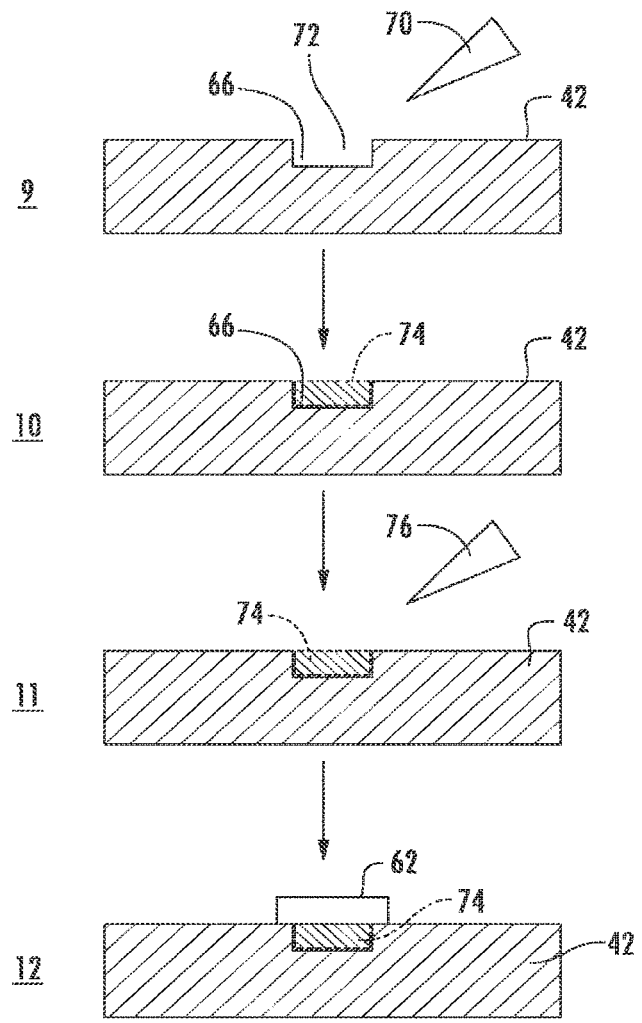
FIG. 5 is a flow diagram for a multi-laser continuous process for creating an electronic circuit trace on a substrate.

One embodiment of a continuous process is depicted in FIG. 5, which can utilize a multi-laser process for creating the electronic circuit trace 62 on the substrate 42. The substrate 42 may be molded in a standard mold using a resin that can be laser activated or the substrate 42 can be a simple plastic. As can be appreciated, the substrate 42 is illustrated in cross-section in FIG. 5. At Step 9, a laser 70 is used to ablate the surface of the substrate 42 to form a pattern 66. The desired interconnect pattern 66 is inscribed on the molded substrate 42 utilizing the laser 70. In an LDS process, the laser-activatable materials include an additive that is activated by a reaction induced by the focused beam from the laser 70. By ablating the polymer matrix and activating the metals in the resin, the laser 70 creates the pattern 66 that allows for subsequent attachment of a metal during electroless plating (which is shown in Step 10) to form the electronic circuit traces 62. It is also possible that pattern 66 can be applied by an inkjet process that directs the appropriate plating on the activated surface so that the plating attaches to form the electronic circuit traces 62. As electroless plating tends to be slow it will often be more desirable to place the part 46 in an electrolytic plating bath.

If the process is not an LDS process then the laser 70 will ablate the surface of the substrate 42 and simply remove some material. It turns out that the removal of some of the substrate 42 acts to create a channel 72 that is roughened and thus better able to accept a conductive ink or paste 74 directly. In Step 10, a conductive ink or paste 74 can be applied with an inkjet process, aerosol process or screening process so as to provide a circuit trace pattern.

The ink or paste 74 can have high conductivity and low binder content so as to increase its conductivity. The ink or paste 74 further should have high chemical stability in plating baths and a viscosity that is compatible with the desired dispense methods. The deposited ink or paste 74 is then sintered through a laser or flash heat 76 as illustrated in Step 11. The sintering step (Step 11) helps insure that the ink or paste 74 adheres to the substrate 42 and also ensures that the ink or paste 74 is conductive (as it often is the case that the ink or paste 74 as applied will not be sufficiently conductive to allow for a potential to be applied to the electronic circuit trace 62). As can be appreciated, the electroless plating process can skip the sintering step (Step 11) as there is no need to sinter the electroless plating. Finally, in Step 12, electroplating is performed so that a desirable thickness of copper (or other desirable conductive element) is provided to form the electronic circuit trace 62. The increased thickness allows for increased current carrying capability and, in general, the electroplating process tends to create a material that has a high conductivity, thus the performance of the resultant electronic circuit trace 62 is improved.

A preferred system and process uses multiple lasers 70, 76 integrated into a single station. A first laser 70 ablates the surface (Step 9) while a second laser 76 sinters the material (Step 10) immediately after the conductive ink or paste 74 is applied in Step 9. This design saves space in the manufacturing process and helps to insure that each laser 70, 76 is properly registered. In addition, the integration of multiple lasers 70, 76 in a single station enables faster processing of the material.

In another embodiment, the pattern 66 on a surface of the substrate 42 can be prepared with a laser, a plasma process (which can be a vacuum or atmospheric process), a UV process and/or a fluorination process. Once the surface has the pattern 66 formed on it by the chosen process the pattern 66 can be inked or pasted with the desired process and then sintered. The sinter can be via a laser or other desirable processes that provides sufficient thermal energy to fuse the nanoparticles in the ink. Preferably, the pattern 66 is electrically connected to the carrier 40 so that a potential can be placed on the pattern 66 and pattern 66 can be electroplated to form the electrical circuit traces 62. The above processes can be used on a Syndiotactic Polystyrene (SPS) provided by XAREC and provide good retention of the electrical circuit traces 62 to the surface.

Another material that is suitable for additive manufacturing is Liquid Crystal Polymer (LCP) as many LCPs have good temperature resistance and dimensional stability suitable for molding. It turns out that for LCP materials there is a surprising improvement in retention of the electrical circuit traces 62 if a laser process is used to pretreat the surface (compared to other processes). Once the surface is roughened with a laser, a conductive ink can be deposited on the laser marked pattern using a variety of systems, including a nScrypt micropump, an Optmec aerosol, a screen printing process, or an inkjet process. The ink can then be sintered with a laser, a photonic flash curing process, a conventional thermal exposure and for copper based inks, a formic acid environment in an oven.

Another alternative to putting an electrical circuit trace 62 on LCP is to use a plasma process to direct copper directly on the surface. The resulting electrical circuit trace 62 is not as conductive as a pure copper trace but is more than sufficient to allow for a voltage potential to be placed on the electrical circuit trace 62. One issue with the use of plasma is that the pattern 66 tends to be less fine than might be desired. It has been determined, however, that a rough pattern can be formed and then made more precise by the use of a laser, such as a picosecond laser, that can be used to ablate the unwanted copper from the surface without significantly affecting the surface. The laser thus removes the edges so as to form the pattern 66 that provides the desired functionality. As can be appreciated, the plasma process can avoid the need for a sintering or any pretreatment steps and the copper material that is applied directly to the surface via the plasma process is much less expensive than conventional conductive inks. The pattern 66, once formed, can be electroplated as discussed above to form the electrical circuit traces 62.

Figure 7:
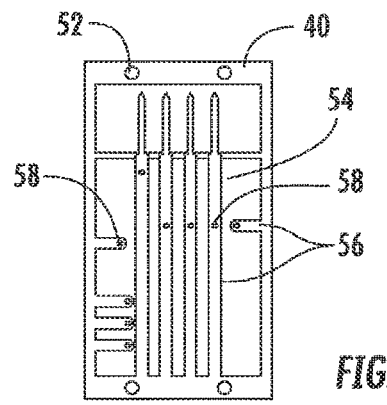
FIGS. 7-12 illustrate an embodiment of an assembly going through the process illustrated in FIG. 6.
Figure 8:
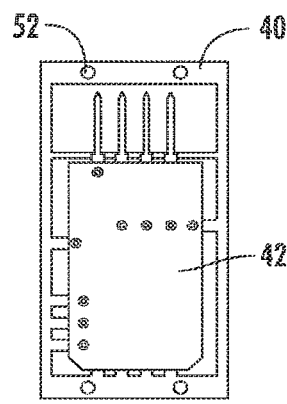
Figure 9:
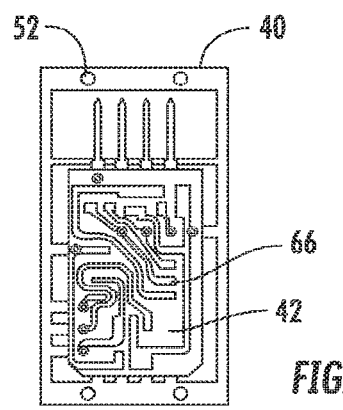

As can be appreciated from FIGS. 7-12, the disclosed processes allow for interesting structures. FIG. 7 illustrates the lead frame 54 that can be transported in a reel-to-reel manner (from reel 68a to reel 68b) during manufacturing by forming the lead frame 54 as a portion of the carrier 40. Specifically, the lead frame 54 is formed as a portion of the carrier 40 and then can be insert-molded into the substrate 42 such as is depicted in FIG. 8, and then treated as discussed above to provide the pattern 66 on a surface of the substrate 42, such as is provided in FIG. 9. It should be noted that the lead frame 54 has fingers 56 with apertures 58 provided in them. These apertures 58 are aligned with access apertures 60 in the molded material that forms the substrate 42. This has been determined to allow for ease of electrical connection to the subsequently formed electrical circuit traces and makes it possible to provide a voltage on the electronic circuit traces by applying a voltage to the lead frame 54 and thus facilitates electroplating. Thus, the use of apertures 60 in the lead frame 54 is beneficial for manufacturing purposes.

Figure 10:
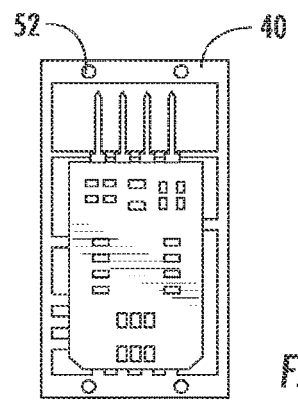
Figure 11:
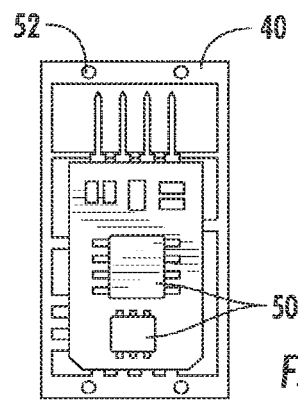
Figure 12:
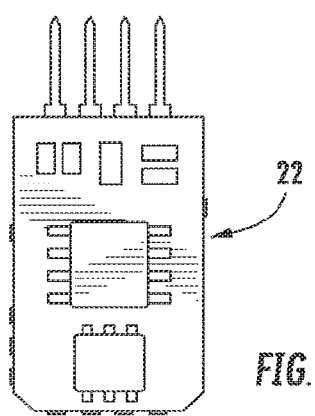

The substrate 42 may be solder masked, and components 50 soldered to the electronic circuit traces 62, as shown in FIGS. 10 and 11, and then the resultant device 22 can be singulated from the carrier 40. Alternatively or in addition to the solder masking/soldering, the components 50 may be wire bonded to the electronic circuit traces 62. The resultant device 22, as shown in FIG. 12, allows for an integrated device 22 that can be formed in a substantially additive manner. As electroplating is a relatively effective process, a reciprocating path through a plating bath with a relatively short dwell time of less than thirty minutes may be sufficient, thus allowing the total process to be less than an hour while enabling a complex set of geometries and configurations. Naturally, adding additional layers of plating may add to the total time of the manufacturing process but still should provide for substantial reductions in total time, from end to end, compared to conventional processes that use PCBs.

In an embodiment where the manufacturing process is applied to internal layers, first, the appropriate traces are provided on the outer surface of a first layer of substrate 42 and, if desired, components (either packaged, bare die or both) can be positioned on the outer surface of the first layer of substrate 42 and soldered or wire-bonded so as to become electrically connected to the these traces. Then a second layer of substrate 42 can be molded over all or a portion of the outer surface and the components. Additional traces can be provided on the second layer as discussed above and then additional components can be positioned on the new surfaces and these components can then be connected to the traces as discussed above. Further layers can be added as desired, keeping in mind that each layer can have a different topology. Thus, without limitation, a first layer could be relatively flat/planar and a second layer could be formed over the first layer in a manner so as to provide a non-planar surface. Naturally, the inverse could also be done. The resultant structure can thus have a three-dimensional shape with internal layers that vary as desired and that may not match external layers.

Figure 15:
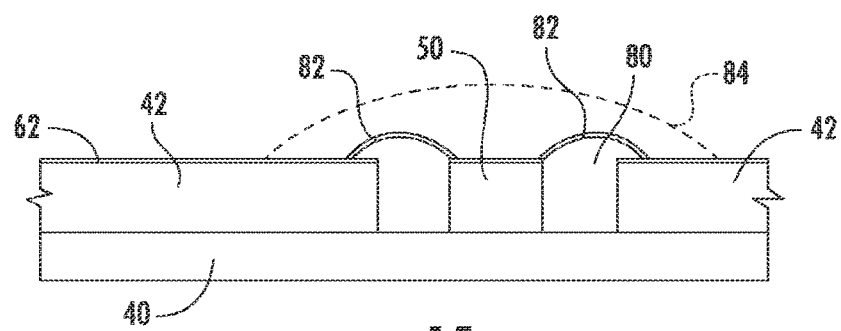
FIG. 15 is a cross-sectional view of a portion of a carrier and molded substrate, and showing a component seated thereon.

As shown in FIG. 15, in an embodiment, when the substrate 42 is molded to the carrier 40, the substrate 42 is discontinuous such that pockets 80 are formed in the substrate 42 and the material of the carrier 40 is exposed. The components 50 (components 50 being one or more individual components, each being in either a packaged or bare die form) can be placed directly onto the outer surface of the carrier 40 that is exposed. The components 50 can be wire bonded by wire bonding 82 to the electronic circuit traces 62 formed on the substrate 42. The carrier 40 acts as a heat sink for the components 50. A non-conductive material 84, such as an adhesive may be provided over the components 50 and the wire bonding 82; this non-conductive material 84 then forms part of the outer surface of the substrate 42. Suitable non-conductive materials 84 include, but are not limited to, a non-conductive adhesive.

Figure 16:
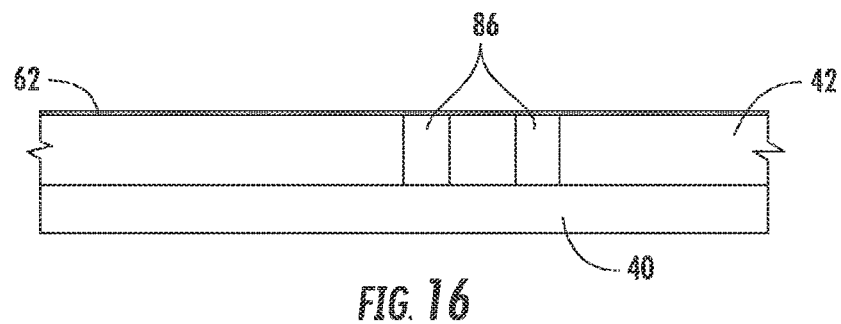
FIG. 16 is an alternate cross-sectional view of a portion of a carrier and molded substrate.

As shown in FIG. 16, in an embodiment, when the substrate 42 is molded to the carrier 40, the substrate 42 is discontinuous such that vias 86 are formed in the substrate 42 to expose the carrier 40. The vias 86 are selectively electroplated to form a conductive pathway between the traces 62 and the carrier 40, as desired. The components 50 can be placed within the vias 86. The components 50 can be wire bonded by wire bonding 82 to the electronic circuit traces 62. The carrier 40 again acts as a heat sink for the components 50 through the vias 86. A non-conductive material 84, such as an adhesive may be provided over the components and the wire bonding 82; this non-conductive material 84 then forms part of the outer surface of the substrate 42. Suitable non-conductive materials 84 include, but are not limited to, a non-conductive adhesive. If desired, the vias 86 may be formed within a pocket formed in the substrate 42, and the components 50 seated within the pocket.

Figure 19:
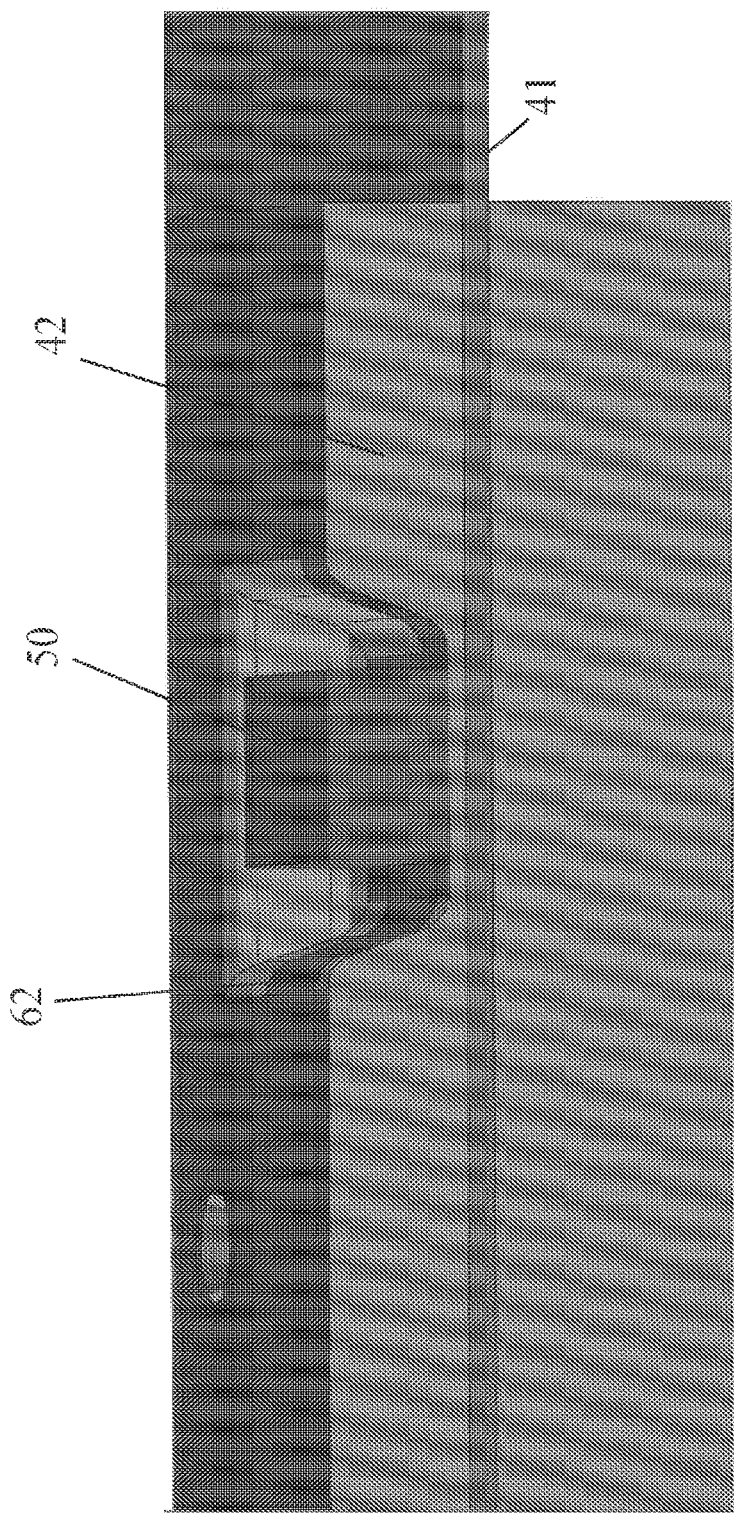
FIG. 19 is a cross-sectional, perspective view of a portion of a carrier and molded substrate, showing a component seated thereon.
Figure 20:
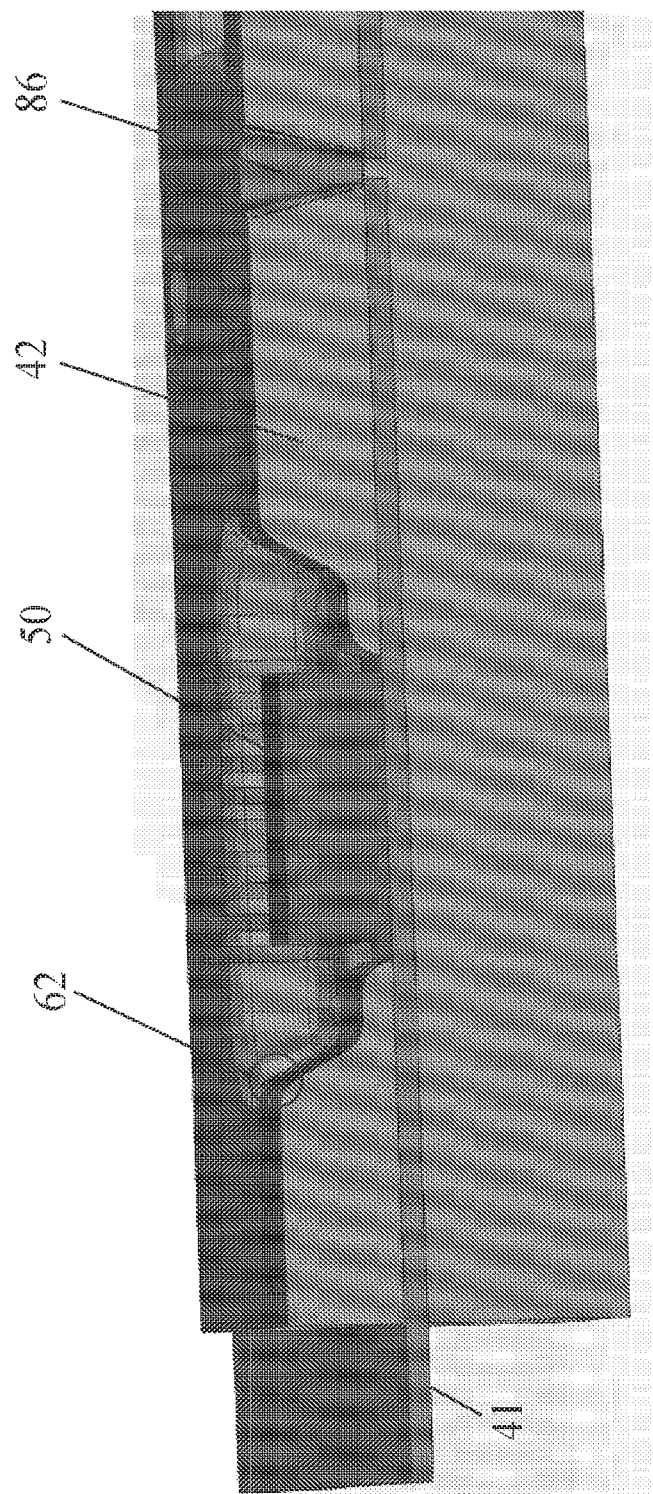
FIG. 20 is a cross-sectional, perspective view of a portion of a carrier and molded substrate, showing a component alternatively seated.
Figure 21:
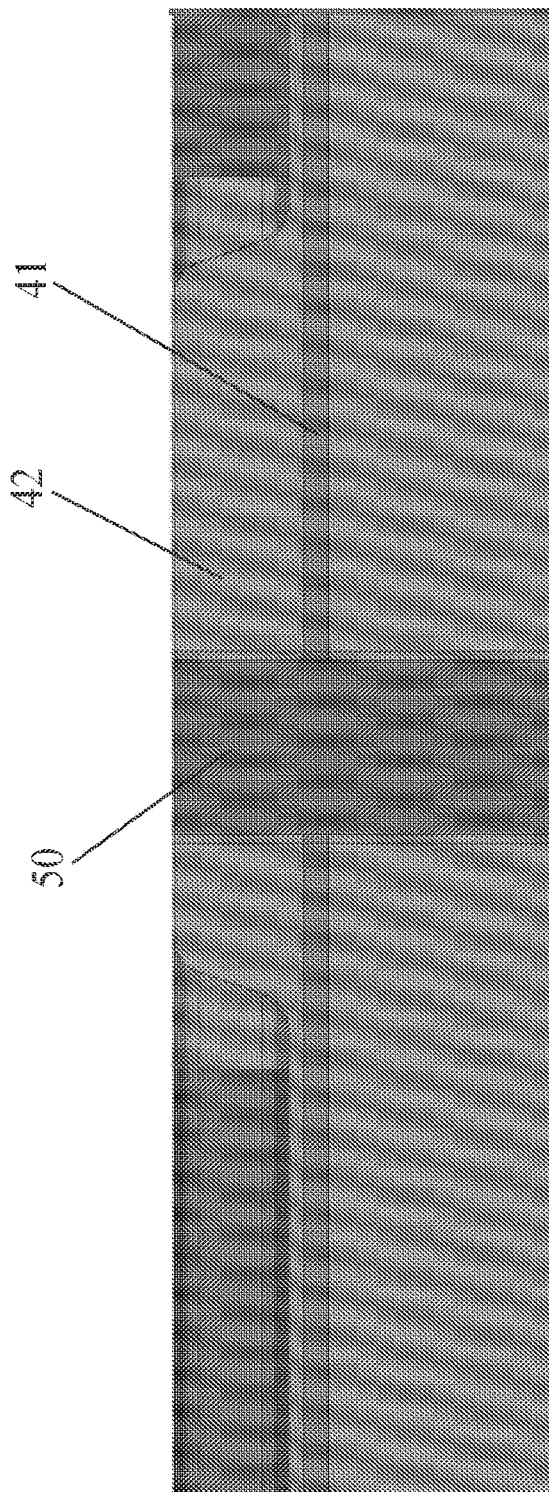
FIG. 21 is a cross-sectional view of a portion of a carrier and molded substrate, showing a component seated therein.

There are many possibilities for the placement and electrical connection of packaged and/or bare die components 50. FIGS. 19-21 illustrate some of the possibilities. As shown in FIGS. 19-21, substrate 42 is molded over carrier 41 in a non-uniform/discontinuous manner such that pockets (i.e., recesses) are formed in the substrate 42. Depending on the embodiment, carrier 41 may comprise a metal or polyimide flex material and may or may not be exposed in a pocket in which components 50 are placed. In FIG. 19, for example, carrier 41 is not exposed below components 50, while in FIG. 20 carrier 41 is exposed below components 50. Although components 50 may be placed upon carrier 41, they may not be electrically connected to carrier 41. For example, carrier 41 may act as a heat sink for components 50 but not provide a direct electrical connection. In FIG. 21, components 50 are placed within an aperture of carrier 41. Again, components 50 may or may not be electrically connected to carrier 41.

As previously mentioned, there are many possibilities for the electrical connection of packaged and/or bare die components 50. The connections may be made either by wire bonding or soldering, and the components 50 may be electrically connected to one or more of the carrier 41, vias 86 or traces 62 (which may be formed down into the pocket, formed on the substrate outer surface (perhaps on either side of the carrier 41) or on an intermediate substrate layer).

While device 22 has been described and depicted as having a particular shape and configuration with particular circuits, components, pins, etc., device 22 is intended as an example device to more clearly illustrate and describe ASEP manufacturing techniques using a specific example Thus, various embodiments are described above with reference to device 22; however, these are just examples of some of the variations to what is collectively referred to as ASEP and/or ASEP devices. Through ASEP, it is possible to integrate connectors, sensors, LEDs, thermal management, antennas, RFID devices, microprocessors, memory, impedance control, and multi-layer functionality directly into a product.

Figure 13:
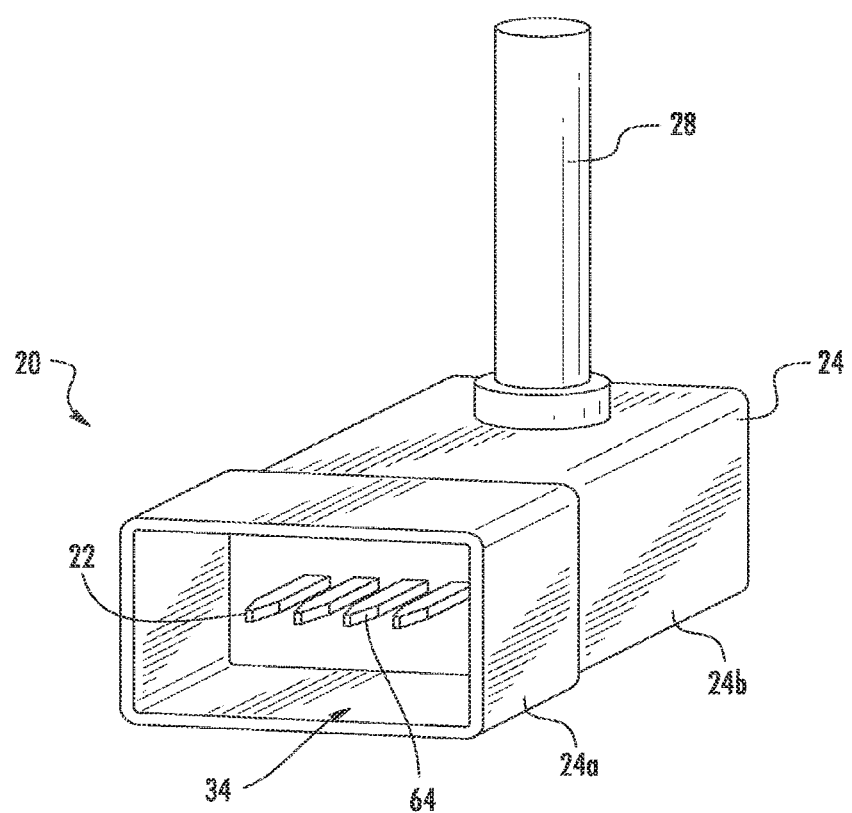
FIG. 13 illustrates a perspective view of an automotive light formed by the manufacturing process.

One example is light 20, as shown in FIG. 13, which comprises a device such as device 22 that can be formed using ASEP techniques. Although light 20 is purposed in the example below for use in a vehicle or automobile, it may just as well be used for a general purpose light. For example, light 20 could be used for lighting inside or out, in or for a display, on a person or apparel, or as part of a mobile personal device. Possible uses for light 20 are too numerous to list, especially considering uses in or with equipment or machinery, as an example.

Figure 14:
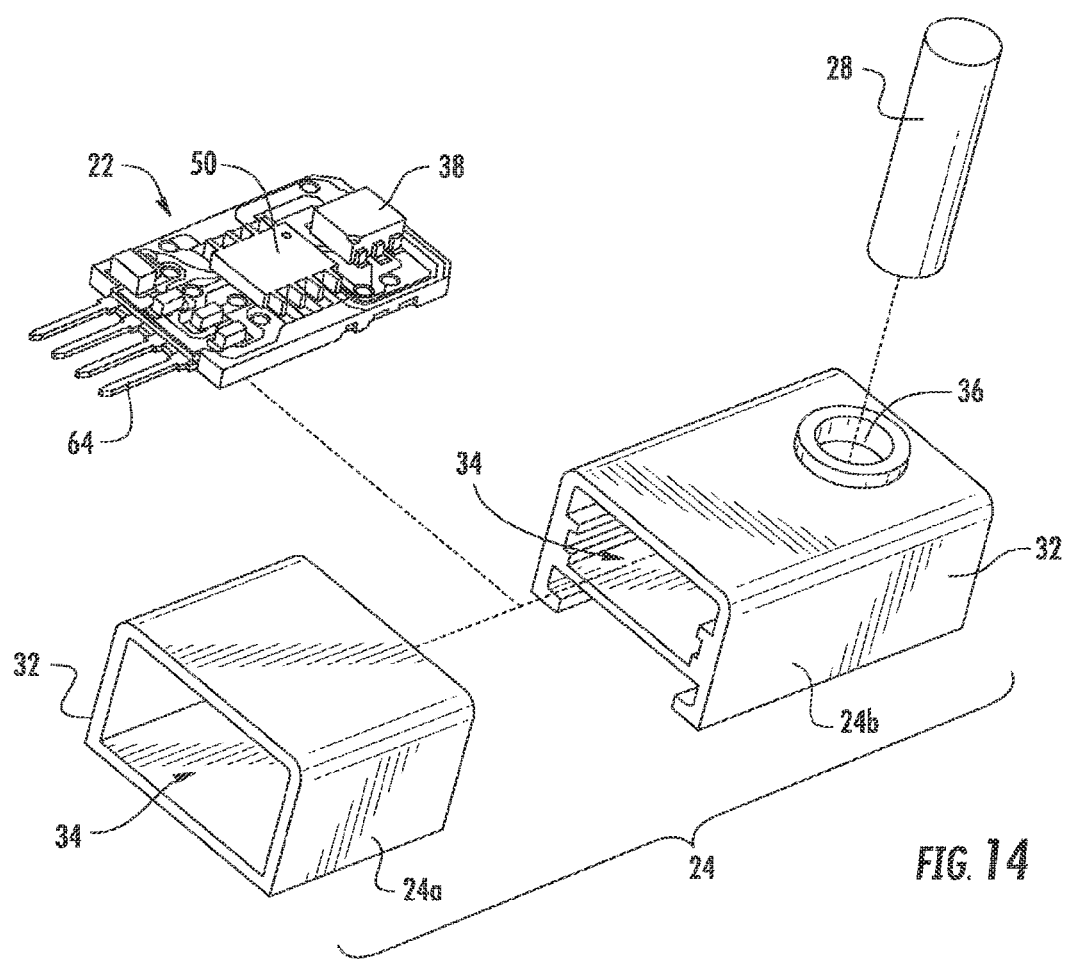
FIG. 14 is an exploded perspective view of the automotive light.

The automotive light 20 includes a housing 24, the device 22 and a light pipe 28. The housing 24 may be formed in two parts 24a, 24b as shown in FIG. 14. The housing 24 has a wall 32 forming a passageway 34 therethrough, and an aperture 36 which extends through the wall 32 and is in communication with the passageway 34. The aperture 36 may be transverse to the passageway 34. The device 22 which is formed using an ASEP manufacturing process is mounted within the passageway 34 of the housing 30. The light pipe 28 extends through the aperture 36 in the housing 30 and is mounted above a light emitting diode (LED) 38 which is formed as component 50 (or one of components 50) on the device 22 as described herein.

Figure 1A:
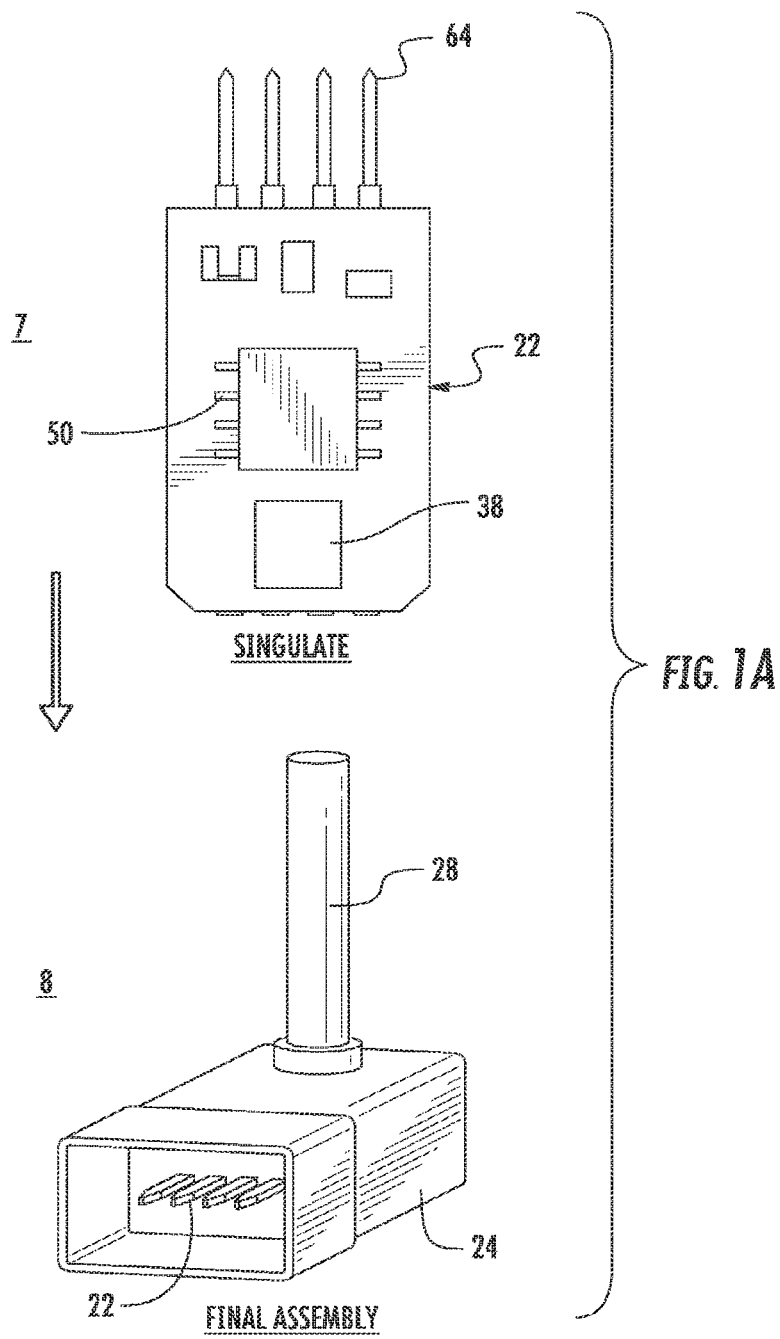
FIG. 1A is a flow diagram of further steps of a manufacturing process.

FIG. 1 in combination with FIG. 1A provide a representative indication of the automotive light 20 being made and the steps followed to make the automotive light 20. Steps 7 and 8 of FIG. 1A and also reference numeral 140 of FIG. 6 shows that the device 22 is singulated from the other devices and is assembled with the housing 24 and light pipe 28. See the description of FIGS. 1 and 6 above for further details. After the device 22 is formed, the device 22 is mounted in the passageway 34 of the housing 24 and the parts 24a, 24b of the housing 24 are assembled together. The pin contacts 64 remain exposed. The light pipe 28 is mounted through the aperture 36 in the housing 24 and is provided above the LED(s) 38. This completes the assembly of the automotive light 20. The automotive light 20 is now ready to be assembled with a vehicle.

As mentioned above, various embodiments are described and various examples of devices that may be formed using ASEP techniques are provided herein. In another example, multi-layer flexible circuits can be reel to reel insert molded with a high temperature/3D substrate such as LCP or SPS. Vias can be molded into the surface of the substrate that would create an electrical path between the traces that are printed onto the surface of the plastic and the internal layers of the flexible circuit. These traces create an "electrical buss bar" to the carrier which enable the traces to be electroplated after the inkjet deposited conductive layer is applied to the device. Even though the conductive traces of nanoparticle Cu or Ag ink is very thin and not highly conductive relative to bulk metal, their conductivity is high enough to provide a seed layer for electroplating the printed traces on the surface.

Although inkjet technology has limitations with respect to printing circuit patterns onto 3D surfaces, the technology does have a depth of field of roughly 2 mm which enables printing circuit patterns into recesses, pockets, and small raised features into which bare silicon die can be placed. After the die are wire bonded to the traces that are run into the pocket, an electrical connection between the die and system is created, eliminating the need for conventional packaging of the silicon. By not having to use conventionally packaged silicon devices, the size of the end product may be dramatically reduced, and the cost of the silicon packaging eliminated. Furthermore, circuit patterns with lines and spaces of 50 microns can be reliably printed using inkjet technology.

Unlike the manufacturing of conventional PCBs or flex that use 400 gallons of water per square meter during conventional subtractive manufacturing processes, the application of traces to the surface of an ASEP product is additive. The only process step in which water is used is a rinsing process immediately after electroplating. A fully additive process to manufacture circuitry that has the same conductivity, metal types, and surface finishes as standard circuit boards with reduced water use is highly desirable for sustainable electronics manufacturing.

Figure 17:
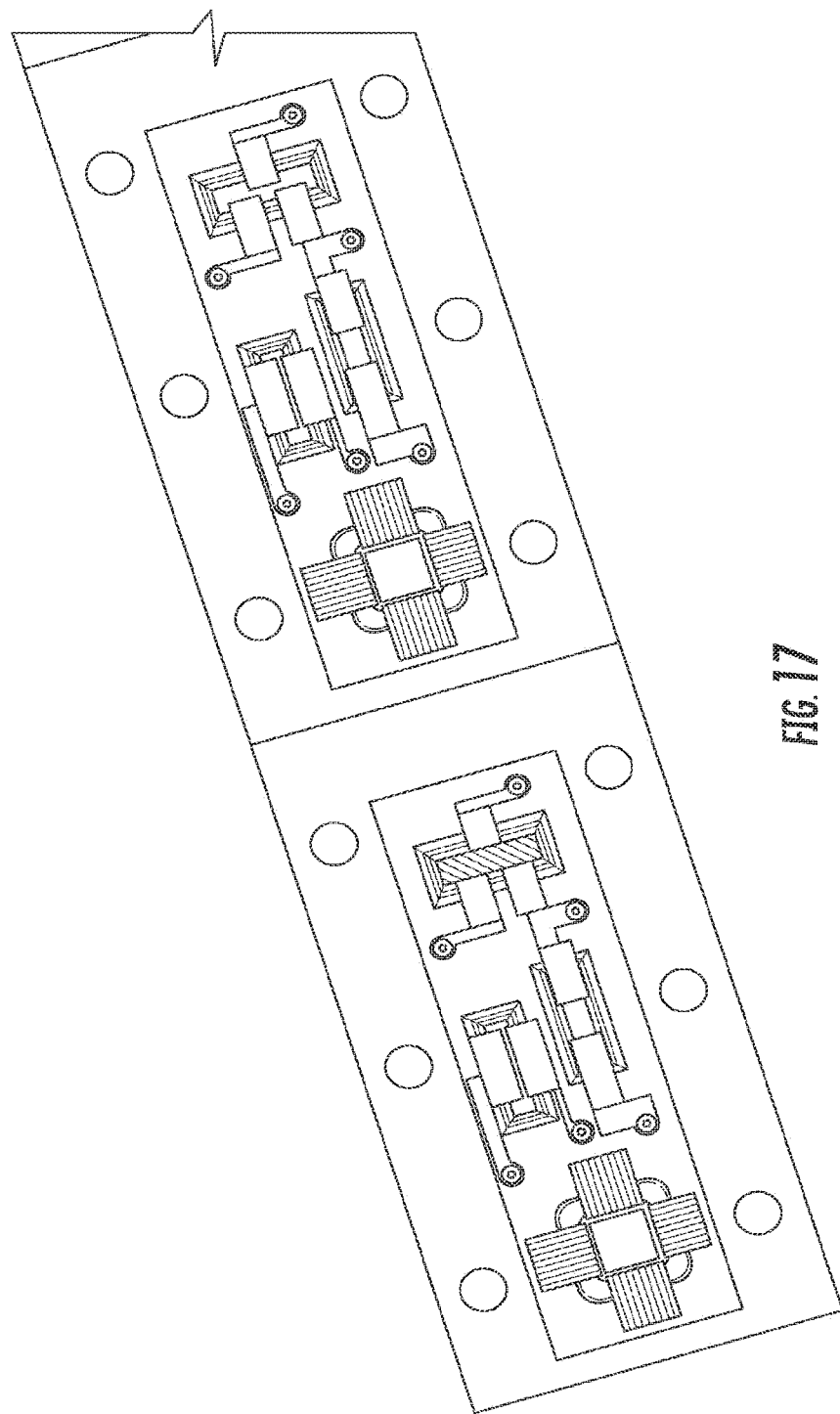
FIG. 17 is a top view illustration of an example ASEP application with a Polyimide Flexible core that is reel to reel manufactured with bare die, active, and passive devices packaged into recesses of the molded and imaged substrate.
Figure 18:
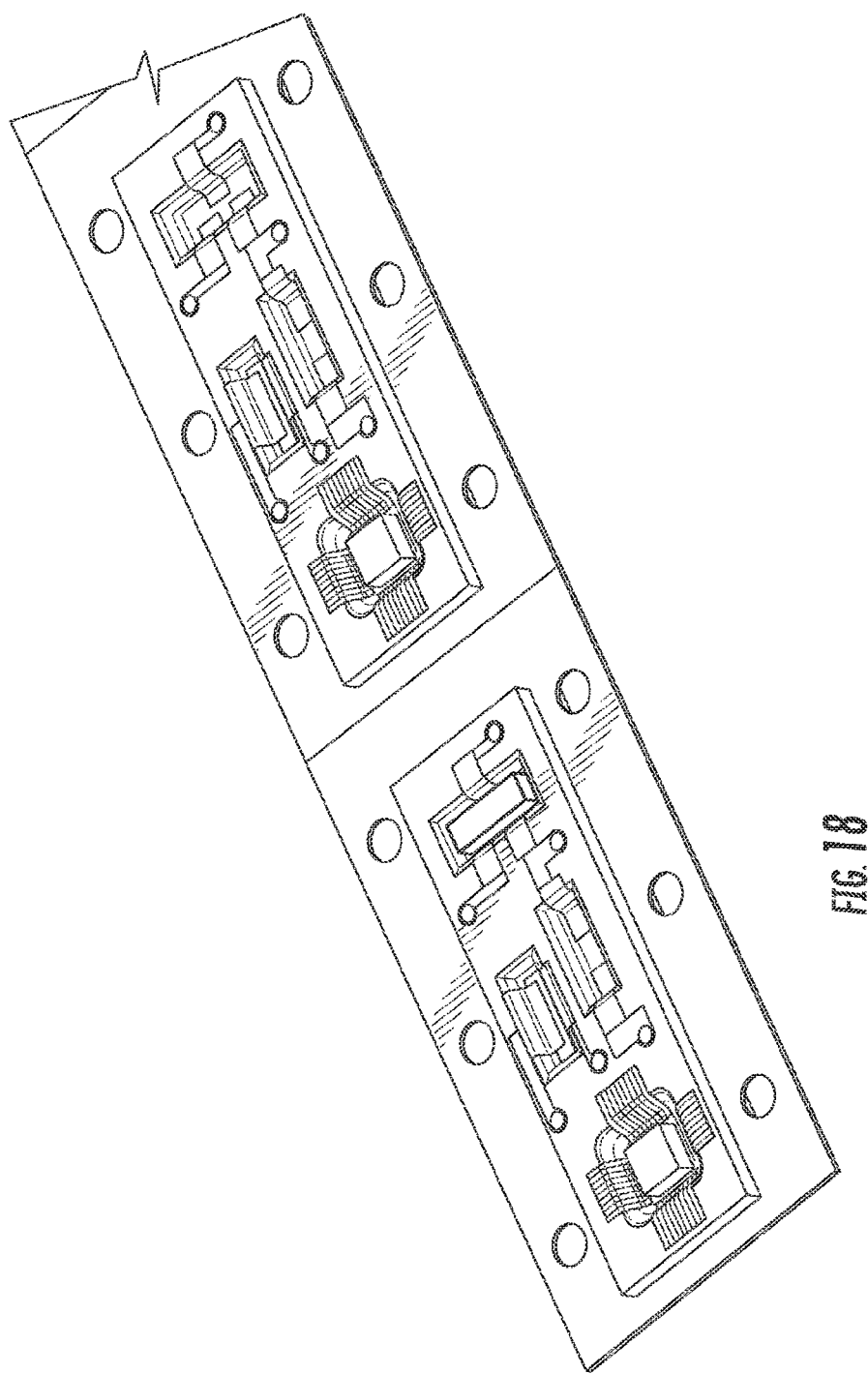
FIG. 18 is a perspective view illustration of the example ASEP application of FIG. 17.

FIGS. 17 (top view) and 18 (perspective view) illustrate a conceptual design of an ASEP application with a Polyimide Flexible core that is reel to reel manufactured with bare die, active, and passive devices packaged into recesses of the molded and imaged substrate. After the devices are either wire bonded or soldered into place, they can be "glob topped" using a non-conductive material. If needed, it would be possible to develop applications where there would be no visible electronics in the assembly.

The advantage of such an approach is that it can dramatically reduce the size and cost of electronic products. It enables the integration of bare die directly into plastic enclosures by printing the traces into the pocket(s) into which the bare die are placed, die attaching the die and wire bonding it to the electroplated traces. After "glob topping" the component, one may not even know that there are electronics in the device. Furthermore, by using multi-layer flex internal to the device, a very high density electronic product can be created; components could be on both the front and back of the part, for example.

As mentioned above, various embodiments are described and various examples of devices that may be formed using ASEP techniques are provided herein. FIGS. 22, 23 and 23A-23K illustrate additional embodiments of ASEP manufacturing.

Figure 22:
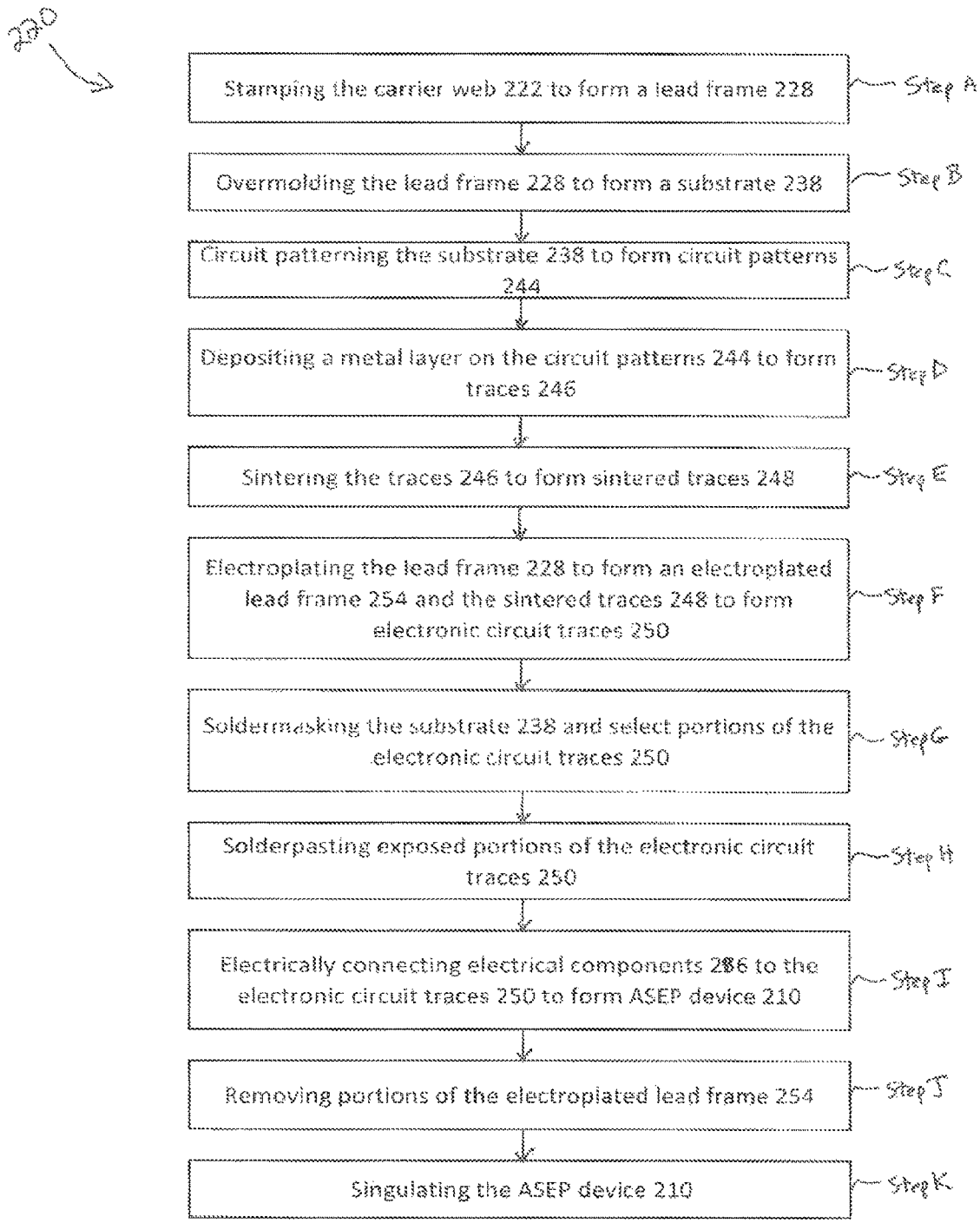
FIG. 22 is a flow chart showing the steps of an embodiment of an ASEP manufacturing process.
Figure 23:
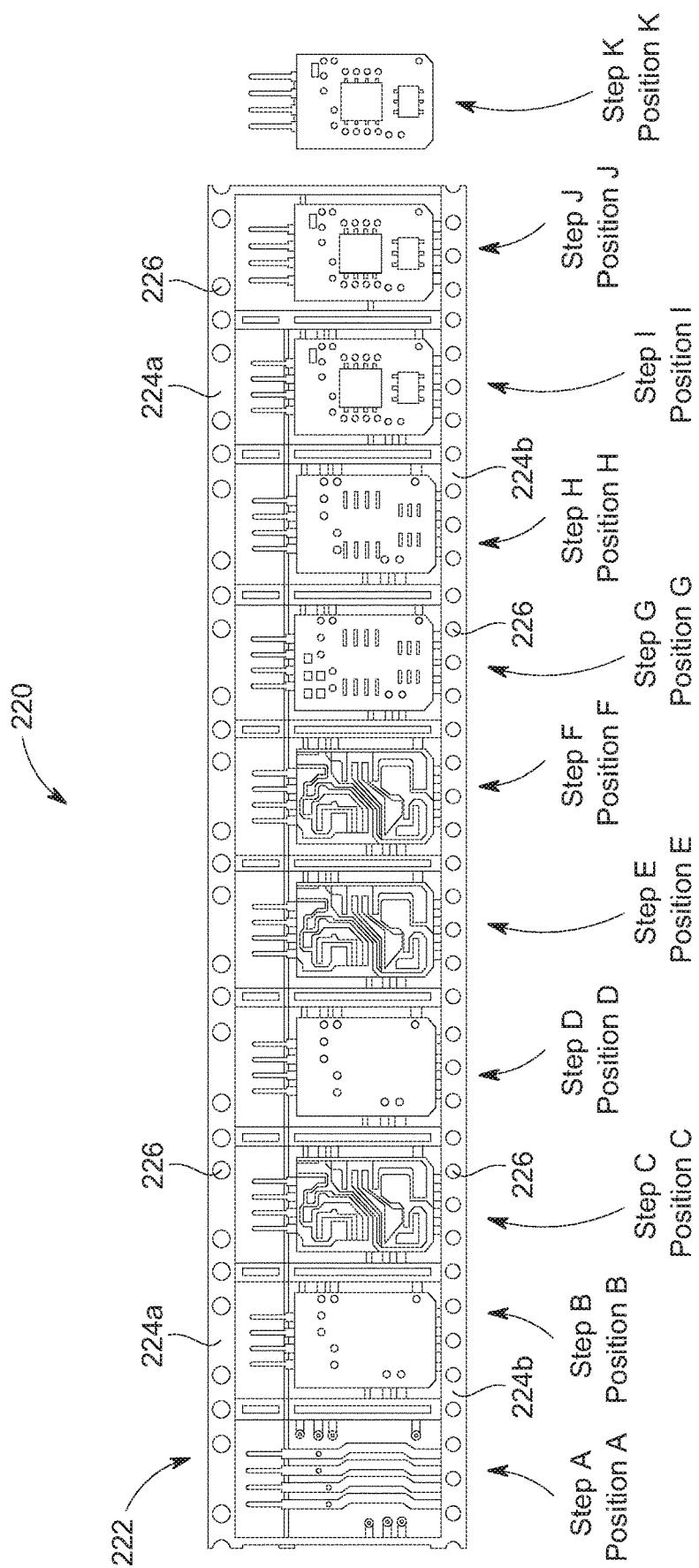
FIG. 23 is a flow diagram of the steps of the embodiment of the ASEP manufacturing process.
Figure 23A:
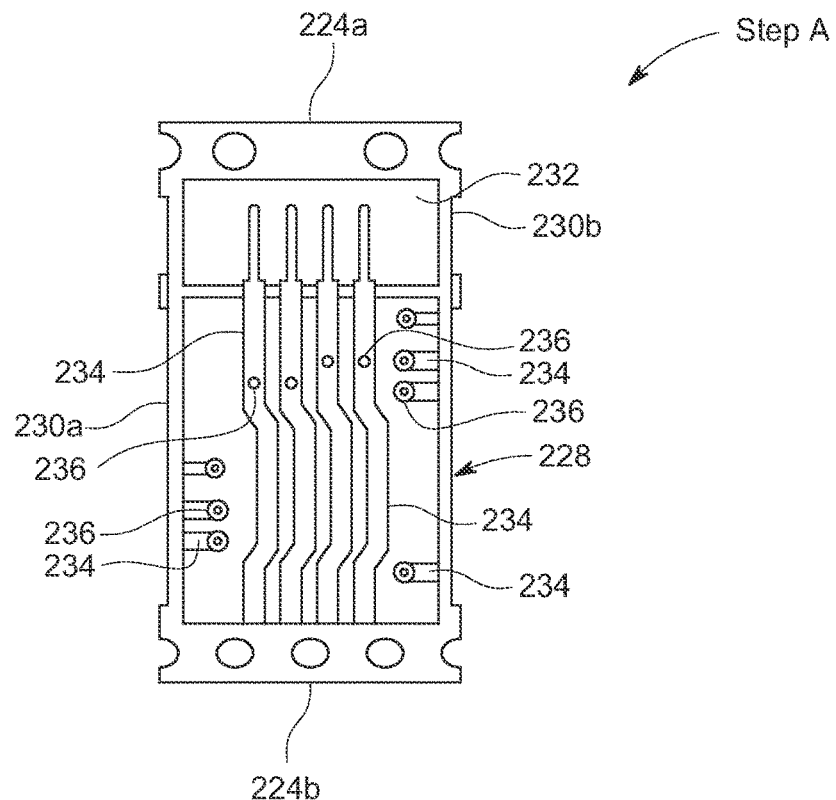
FIGS. 23A-23K illustrate expanded views of the individual steps of the flow diagram of FIG. 23.
Figure 23B:
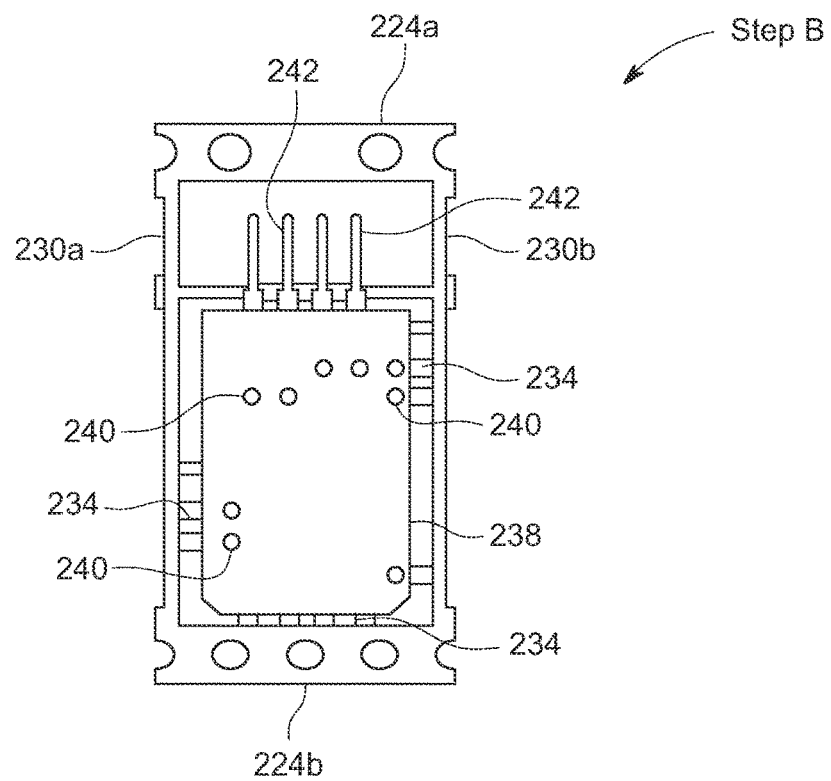

FIG. 22 illustrates a flow chart for an embodiment of an ASEP manufacturing process 220 for building an ASEP device 210. FIG. 23 illustrates a flow diagram of the ASEP manufacturing process 220, which ASEP manufacturing process 220 includes Steps A-K. FIGS. 23A-23K provide enlarged images of Steps A-K, where FIG. 23A illustrates Step A, FIG. 23B illustrates Step B, and so forth.

Advantageously, manufacturing process 220 is preferably continuous for speed and cost reasons. Reel-to-reel technology, such as illustrated in FIG. 23 allows the ASEP device 210 to be formed while attached to a carrier web 222. The carrier web 222 is preferably unspooled from a first (bulk source) reel (not shown) and then, if desired, collected in a second (take-up) reel (not shown), with the manufacturing process 220 taking place between the first and second reels. The carrier web 222 has opposite end portions 224a, 224b and a middle portion (not shown) which spans the distance between the opposite end portions 224a, 224b. The end portions 224a, 224b have carrier holes 226 extending therethrough. The carrier holes 226 allow the carrier web 222 to traverse along a manufacturing line in a continuous flow, like a conveyor belt, between the first and second reels. The carrier web 222 is preferably formed of any desirable conductive metal, such as copper alloy, but may alternatively be formed of polyimide flex materials, such as a flexible circuit with one or more layers (in certain embodiments the flex materials can have four or more layers).

As illustrated in FIGS. 22, 23 and 23A, manufacturing process 220 begins with Step A, where Step A occurs at Position A, which is located between the first and second reels, and after the first reel. In Step A, the middle portion of the carrier web 222 is stamped (thus removing undesired portions of the middle portion of the carrier web 222) to form a lead frame 228. The lead frame 228 is formed in a desired configuration suited for the formation of the ASEP device 210. As best illustrated in FIG. 23A, the lead frame 228 preferably includes the end portions 224a, 224b (it being understood that the end portions 224a, 224b of one lead frame 228 are continuous with the end portions 224a, 224b of the adjacent lead frame 228), a pair of stabilizing portions 230a, 230b (it being understood that stabilizing portion 230a of one lead frame 228 will also preferably act as stabilizing portion 230b of the adjacent lead frame 228), with each stabilizing portion 230a, 230b spanning the distance between the opposite end portions 224a, 224b (which end portions 224a, 224b are preferably not subject to the stamping of Step A). The opposite end portions 224a, 224b and the stabilizing portions 230a, 230b thus generally form a rectangular frame which defines an opening 232 therebetween. The lead frame 228 also preferably includes a plurality of fingers 234 which are connected to any one of the opposite end portions 224a, 224b and the stabilizing portions 230a, 230b and which extend inwardly into the opening 232. Each finger 234 may have one or more apertures 236 provided therethrough.

As illustrated in FIGS. 22, 23 and 23B, manufacturing process 220 continues with Step B, where Step B occurs at Position B, which is located between the first and second reels and after Position A. In Step B, a substrate 238 is overmolded to the fingers 234 of the lead frame 228. The substrate 238 may have apertures 240 provided therethrough which preferably align with the apertures 236 of the fingers 234. As illustrated in FIG. 23B, certain portions 242 of the fingers 234 do not have the substrate 238 overmolded thereto, and are not otherwise connected to any one of the opposite end portions 224a, 224b and the stabilizing portions 230a, 230b. These certain portions 242 may act as contact pins of the ASEP device 210 to be formed. The overmolding of Step B can be performed with single or two shot processes, or any other conventional molding process.

Figure 23C:
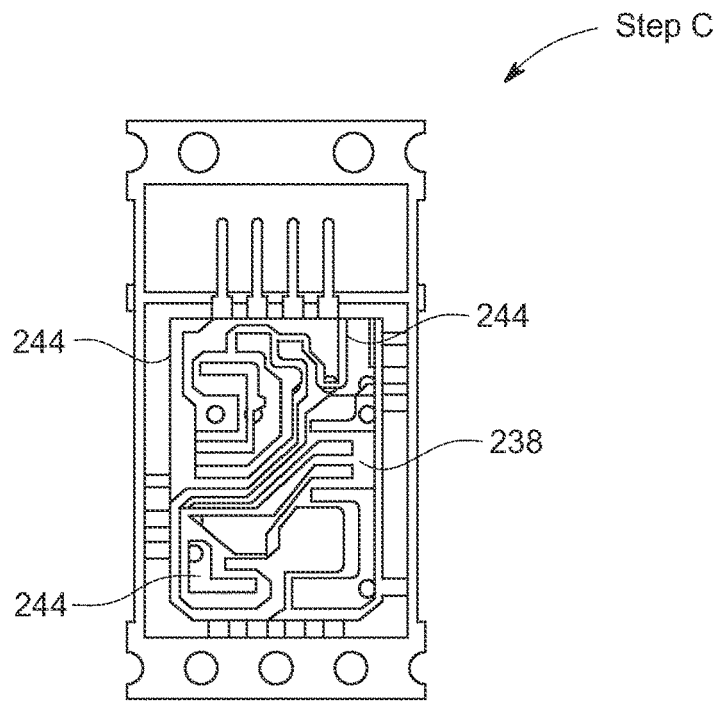

As illustrated in FIGS. 22, 23 and 23C, manufacturing process 220 continues with Step C, where Step C occurs at Position C, which is located between the first and second reels and after Position B. In Step C, circuit patterning is performed on the substrate 238. The circuit patterning provides for one or more circuit patterns 244 to be formed on the surface of the substrate 238. The circuit patterns 244 can be formed by any number of suitable processes, including a laser process, a plasma process (which can be a vacuum or atmospheric process), a UV process and/or a fluorination process. Depending on the process used (e.g., plasma, UV and/or fluorination), the circuit patterning may comprise patterning (i.e., a surface treatment of) most, if not all, of the surface of the substrate 238. Thus, the circuit patterns 244 may be formed on all or nearly all of the surface of the substrate 238.

Figure 23D:
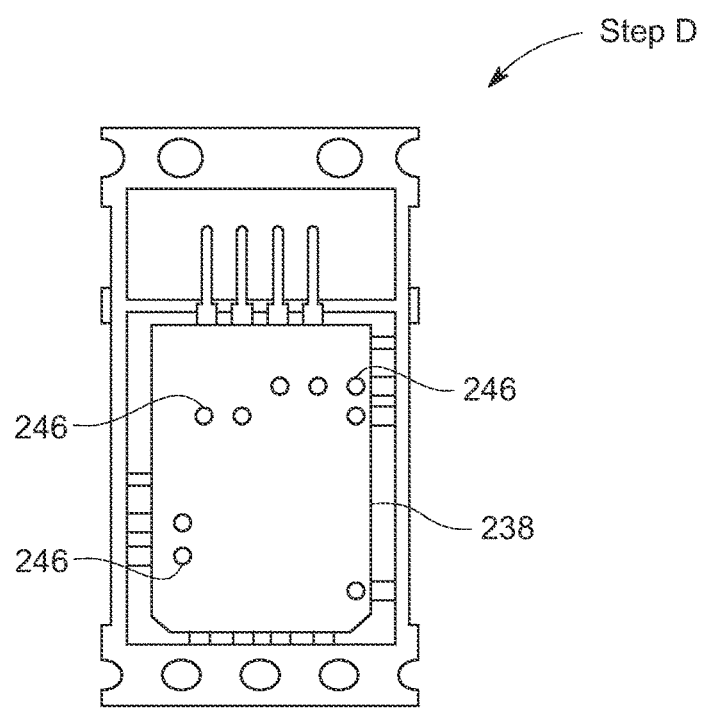

As illustrated in FIGS. 22, 23 and 23D, manufacturing process 220 continues with Step D, where Step D occurs at Position D, which is located between the first and second reels and after Position C. In Step D, a metal layer (commonly referred to as a seed layer) is deposited on the circuit patterns 244 and connected to the substrate 238, which metal layer provides traces 246. The traces 246 also are provided along the walls of the apertures 240, 236, thus electrically connecting the traces 246 to the fingers 234, and thus to the remainder of the lead frame 228 as well. The deposition of the metal layer may be performed by any suitable process, including an electroless plating process, an ink jet process, a screening process or an aerosol process. Depending on the process used, the metal to be deposited may be in any suitable form, including ink or paste. The metal to be deposited may have high conductivity and low binder content so as to increase its conductivity. The metal to be deposited preferably has high chemical stability in plating baths and a viscosity that is compatible with the desired deposition process. While not illustrated, it is to be understood that portions of the fingers 234 can act as internal buss(es) which are electrically connected to the traces 246 on the surface of the substrate 238.

Figure 23E:
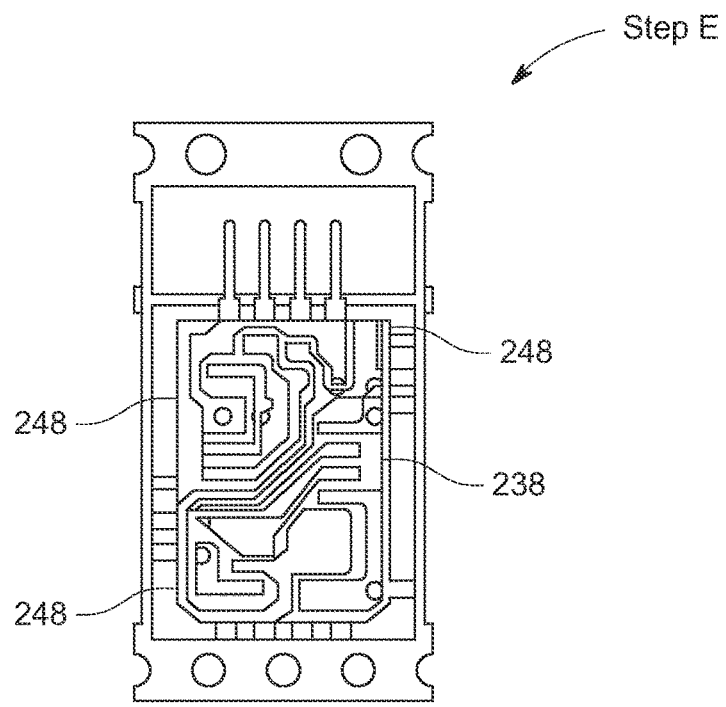

As illustrated in FIGS. 22, 23 and 23E, manufacturing process 220 continues with Step E, where Step E occurs at Position E, which is located between the first and second reels and after Position D. In Step E, the traces 246 are sintered, thereby forming sintered traces 248. The sintering process can be performed by a laser or by flash heat, or any other desirable process that provides sufficient thermal energy, for instance, to fuse the nanoparticles in an ink. Sintering helps insure that the deposited metal forming the traces 246 adheres to the substrate 238 and also ensures that the deposited metal is conductive (as it often is the case that the deposited metal as applied is not sufficiently conductive to allow for a voltage potential to be applied to the traces 246). As can be appreciated, if Step D is performed with an electroless plating process, then Step E does not need to be performed, as there is no need to sinter the electroless plating.

It should further be noted that, if both Step C and Step E are performed using lasers, that a preferred system and process would have multiple lasers integrated into a single station/position, thereby saving space in the manufacturing process 220 and helping to insure that laser is properly registered. In addition, the integration of multiple lasers in a single station/position enables faster processing of the material.

Figure 23F:
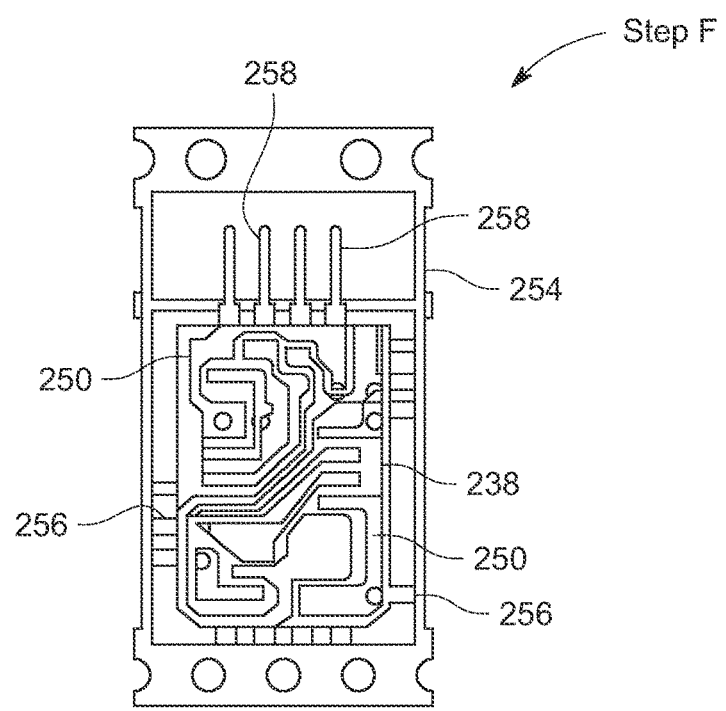

As illustrated in FIGS. 22, 23 and 23F, manufacturing process 220 continues with Step F, where Step F occurs at Position F, which is located between the first and second reels and after Position E. In Step F, the traces 246/sintered traces 248 are electroplated by applying a voltage potential to the lead frame 228 (which is electrically connected to the traces 246/sintered traces 248 via the internal buss(es)) and exposing the lead frame 228, the substrate 238 and the traces 246/sintered traces 248 to an electroplating bath. The electroplating process not only electroplates the traces 246/sintered traces 248 to form electronic circuit traces 250, but electroplates the lead frame 228 to form an electroplated lead frame 254, which has electroplated fingers 256 having electroplated contact pin portions 258. Step F can involve a single step plating process which builds up a single layer of a single material, such as copper, or can involve a multi-step plating process which builds up multiple layers of multiple materials, such as a copper layer and a tin layer, it being understood that other suitable materials could also be used. The increased thickness allows for increased current carrying capability and, in general, the electroplating process tends to create a material that has a high conductivity, such that the performance of the resultant electronic circuit traces 250 is improved.

The connection of the traces 246 to the internal buss(es) enables electroplating of all metals, including copper, nickel, gold, silver, tin, lead, palladium and other materials. The process of forming traces 246 which are connected to the internal buss(es) and then electroplating enables faster deposition of metals than known electroless plating processes. In addition, the plating process is smoother and lower cost when implemented using reel-to-reel technology as compared with more conventional batch processes.

In another embodiment, techniques such as those included in Mesoscribe technology may be used to deposit a full thickness of copper (or other conductive material) on a surface. A picosecond laser may then be used to isolate desired circuit patterns in the conductive material. Such an approach could be used in place of Step F, as described herein, or in addition to Step F, where one or more plated materials are desired.

Steps C, D, E and F may be used on a Syndiotactic Polystyrene (SPS) provided by XAREC and provide good retention of the electronic circuit traces 250 to the surface of the substrate 238.

Figure 23G:
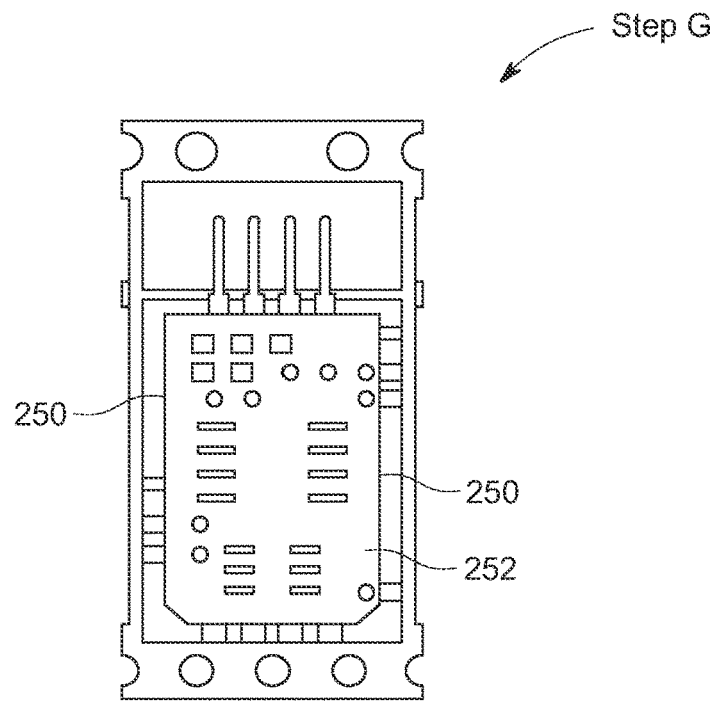

As illustrated in FIGS. 22, 23 and 23G, manufacturing process 220 continues with Step G, where Step G occurs at Position G, which is located between the first and second reels and after Position F. In Step G, a solder mask 252 is applied which covers select portions of the electronic circuit traces 50 and all, or substantially all, of the exposed surfaces of the substrate 238.

Figure 23H:
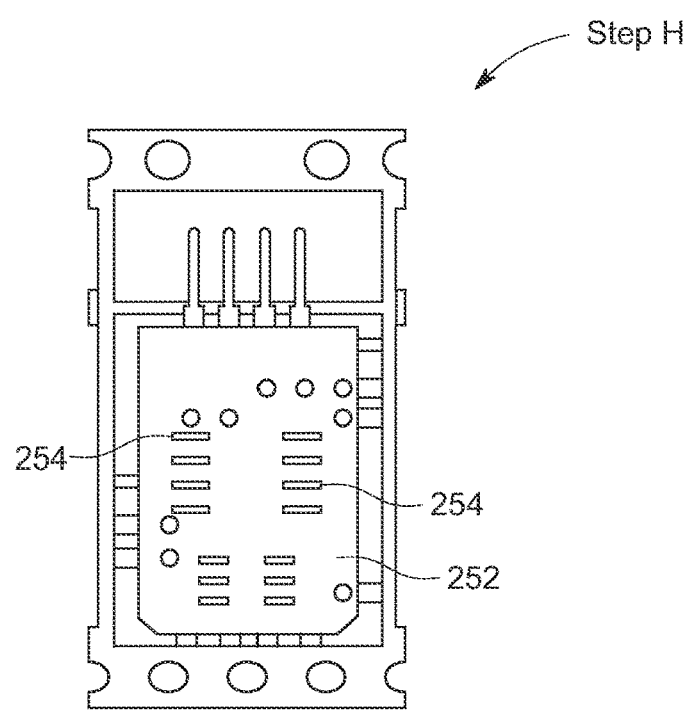
Figure 23I:
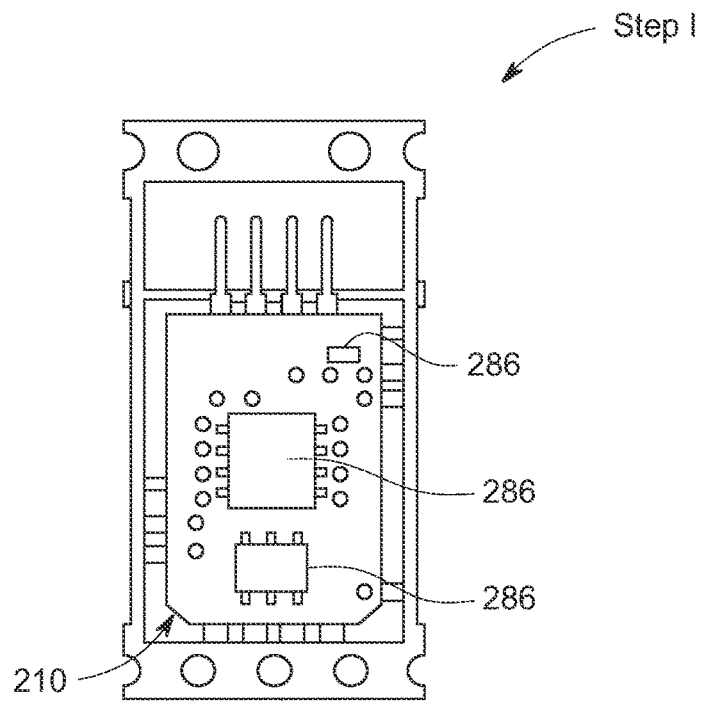

As illustrated in FIGS. 22, 23 and 23H, manufacturing process 220 continues with Step H, where Step H occurs at Position H, which is located between the first and second reels and after Position G. In Step H, solderpaste 254 is stenciled onto the exposed portions of the electronic circuit traces 250 (namely those portions not covered by the solder mask 252).

Figure 23J:
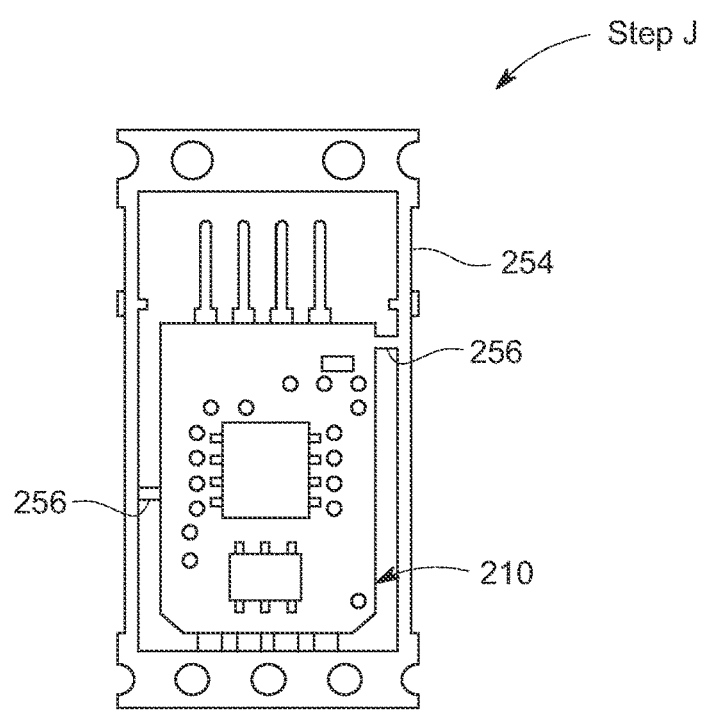

As illustrated in FIGS. 22, 23 and 23J, manufacturing process 220 continues with Step I, where Step I occurs at Position I, which is located between the first and second reels and after Position H. In Step I, electrical components 286 are positioned on the solderpaste 254 in order to electrically connect the electrical components 286 to the electronic circuit traces 250. With the electrical components 286 being position on the solderpaste 254, a reflow process may then be used to form the ASEP device 210. It should be noted that the electrical components 286 may alternatively, or in addition to Steps G and H, be wire-bonded to the electronic circuit traces 250.

As illustrated in FIGS. 22, 23 and 23J, manufacturing process 220 continues with Step J, where Step J occurs at Position J, which is located between the first and second reels and after Position I. In Step J, a majority of the remaining exposed electroplated fingers 256 that are connected to the "frame" of the electroplated lead frame 254 are punched/removed, leaving only a necessary amount (for example, two, as illustrated in FIG. 2J) of exposed electroplated fingers 256 still connected to the "frame" of the electroplated lead frame 254. At this point, if desired, the formed ASEP device 210 can be electrically tested.

Figure 23K:
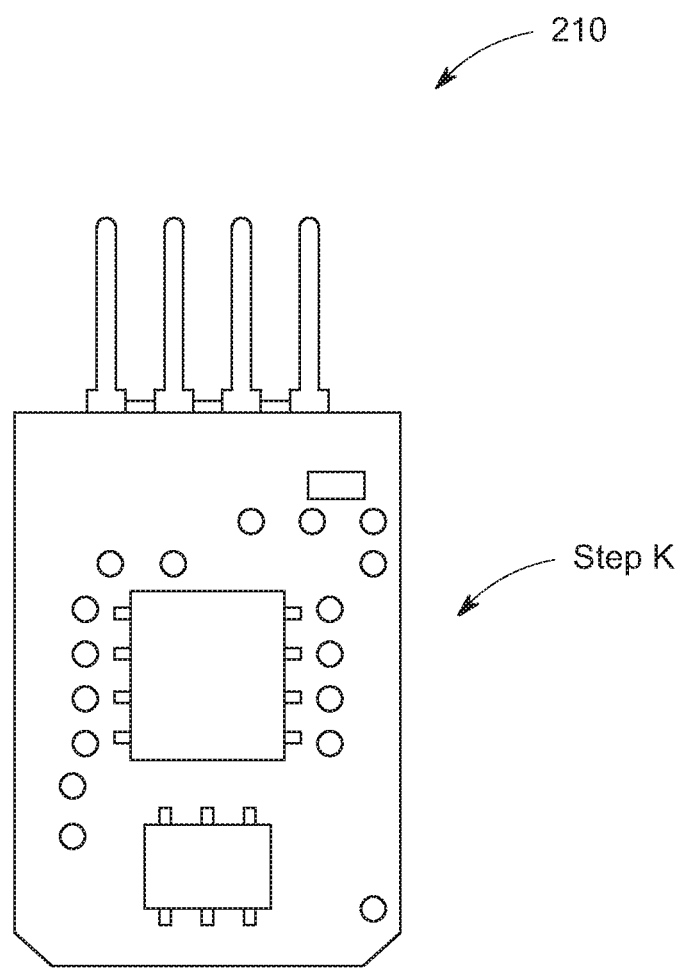

As illustrated in FIGS. 22, 23 and 23K, manufacturing process 220 continues with Step K, where Step K occurs at position K, which is located outside of the first and second reels. In Step K, once the ASEP device 210 is formed, in order for the ASEP device 210 to be used it must be removed from the carrier web 222, in order to singulate the ASEP device 210, where, thereafter, the singulated ASEP device 210 can be used as desired, for instance as a part of a final assembly (not shown).

The ASEP device 210 allows for an integrated device that can be formed in a substantially additive manner. As electroplating is a relatively effective process, a reciprocating path through a plating bath with a relatively short dwell time of less than thirty minutes may be sufficient, thus allowing the total process to be less than an hour while enabling a complex set of geometries and configurations. Naturally, adding additional layers of plating may add to the total time of the manufacturing process but still should provide for substantial reductions in total time, from end to end, compared to conventional processes that use PCBs.

It is to be appreciated that in certain applications not all of Steps A-K will be needed. It is to be further appreciated that in certain applications the order of Steps A-K may be modified as appropriate. It is to be further appreciated that in certain applications the order of Positions A-K may be modified as appropriate and, in some applications, some of the Positions A-K may be identical to other of the Positions A-K.

It should also be appreciated that while the drawings only show the manufacturing process 220 being applied to one side of the substrate 238, that the manufacturing process 220 may be equally applied to other sides of the substrate 238, as well as to internal layers. It should be noted that the use of a metal carrier web 222 may result in a structure that is best suited for applications where there are just two layers (one on both sides of the substrate 238) in addition to the metal carrier web 222. If there is a desire for additional layers then it has been determined that the use of a carrier web 222 formed of a polyimide flex may be more beneficial for allowing additional internal layers to be added.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All processes described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of manufacturing electronic devices comprising:
   forming a continuous carrier formed of an electrically conductive material and having a plurality of fingers, each finger of the plurality of fingers having an aperture therethrough;
   molding a plurality of non-conductive substrates onto the carrier, the plurality of non-conductive substrates having apertures therethrough which are aligned with the apertures of the plurality of fingers;
   forming traces on the substrates;
   electroplating the traces;
   electrically attaching components to the traces to form a plurality of devices, wherein the traces are electrically connected to the plurality of fingers;

singulating one of the devices from the remainder of the carrier.

2. The method of claim 1, wherein forming the traces comprises:
ablating the substrate with a laser;
depositing an ink on the ablated surface; and
sintering the ink.

3. The method of claim 1, wherein pockets are molded into the substrate such that portions of the carrier are exposed.

4. A device comprising:
a singulated carrier portion having a plurality of fingers, at least one finger of the plurality of fingers having an aperture therethrough;
a substrate molded onto the singulated carrier portion, the substrate having at least one aperture therethrough which is aligned with the aperture of the at least one finger;
seed layer traces on the substrate;
plated metal traces on the seed layer traces; and
a component electrically attached to at least one plated metal trace, wherein at least one plated metal trace is electrically connected to the at least one finger of the plurality of fingers.

5. The device of claim 4, wherein the device comprises at least one of a printed circuit board, a flex circuit, a connector, a thermal management feature, EMI shielding, a high current conductor, an RFID apparatus, an antenna, a wireless power device, a sensor, a MEMS apparatus, an LED device, a microprocessor, a memory device, an ASIC, a passive device, an impedance control device, and an electro-mechanical apparatus.

6. The device of claim 4, wherein the component is seated within a pocket formed in the substrate.

7. The device of claim 6, wherein the pocket is formed into the substrate such that a portion of the singulated carrier portion is exposed.

8. The device of claim 4, wherein the singulated carrier portion comprises metal.

9. The device of claim 4, wherein the singulated carrier portion comprises a flex material.

10. The device of claim 9, wherein the flex material comprises a polyimide flex material.

11. The device of claim 4, wherein the plated metal traces comprise electroplated plated metal traces.

12. The device of claim 4, wherein the seed layer traces comprise sintered ink.

13. The device of claim 4, wherein the seed layer traces comprise sintered paste.

14. A device comprising:
a singulated carrier portion having a plurality of fingers, at least one finger of the plurality of fingers having an aperture therethrough;
a substrate molded onto the singulated carrier portion, the substrate having at least one aperture therethrough which is aligned with the aperture of the at least one finger;
conductive traces formed on the substrate with a laser and electroplating;
a component electrically coupled to at least one of the conductive traces, wherein at least one conductive trace is electrically connected to the at least one finger of the plurality of fingers.

15. The device of claim 14, wherein the device comprises at least one of a printed circuit board, a flex circuit, a connector, a thermal management feature, EMI shielding, a high current conductor, an RFID apparatus, an antenna, a wireless power device, a sensor, a MEMS apparatus, an LED device, a microprocessor, a memory device, an ASIC, a passive device, an impedance control device, and an electro-mechanical apparatus.

16. The device of claim 14, wherein the component is seated within a pocket formed in the substrate.

17. The device of claim 16, wherein the pocket is formed into the substrate such that a portion of the singulated carrier portion is exposed.

18. The device of claim 14, wherein the singulated carrier portion comprises metal.

19. The device of claim 14, wherein the singulated carrier portion comprises a flex material.

20. The device of claim 19, wherein the flex material comprises a polyimide flex material.

* * * * *